US012588213B2

(12) United States Patent
Lin et al.

(10) Patent No.: US 12,588,213 B2
(45) Date of Patent: Mar. 24, 2026

(54) SEMICONDUCTOR MEMORY STRUCTURE HAVING ENHANCED MEMORY WINDOW AND METHOD FOR MANUFACTURING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW); Sai-Hooi Yeong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 454 days.

(21) Appl. No.: 18/171,167

(22) Filed: Feb. 17, 2023

(65) Prior Publication Data

US 2024/0099016 A1 Mar. 21, 2024

Related U.S. Application Data

(60) Provisional application No. 63/408,215, filed on Sep. 20, 2022.

(51) Int. Cl.
*H10B 51/30* (2023.01)

(52) U.S. Cl.
CPC .................................... *H10B 51/30* (2023.02)

(58) Field of Classification Search
CPC ...................................................... H10B 51/30
See application file for complete search history.

(56) References Cited

U.S. PATENT DOCUMENTS

2021/0408117 A1* 12/2021 Wu ........................ H10N 50/01
2023/0403858 A1* 12/2023 Lin ...................... G11C 11/1657
2023/0422510 A1* 12/2023 Lin ........................ H10B 51/20
2024/0074205 A1* 2/2024 Lin ........................ H10B 51/10

* cited by examiner

*Primary Examiner* — David Vu
*Assistant Examiner* — Brandon C Fox
(74) *Attorney, Agent, or Firm* — Birch, Stewart, Kolasch & Birch, LLP

(57) ABSTRACT

A memory structure includes a plurality of memory cells arranged in an array. Each of the memory cells includes a memory region, a word line portion disposed on a first surface of the memory region, a first conductive block disposed on a second surface of the memory region opposite to the first surface, a second conductive block disposed on the second surface of the memory region, and a third conductive block disposed on the second surface of the memory region such that the third conductive block is disposed between and separated from the first conductive block and the second conductive block.

20 Claims, 16 Drawing Sheets

100

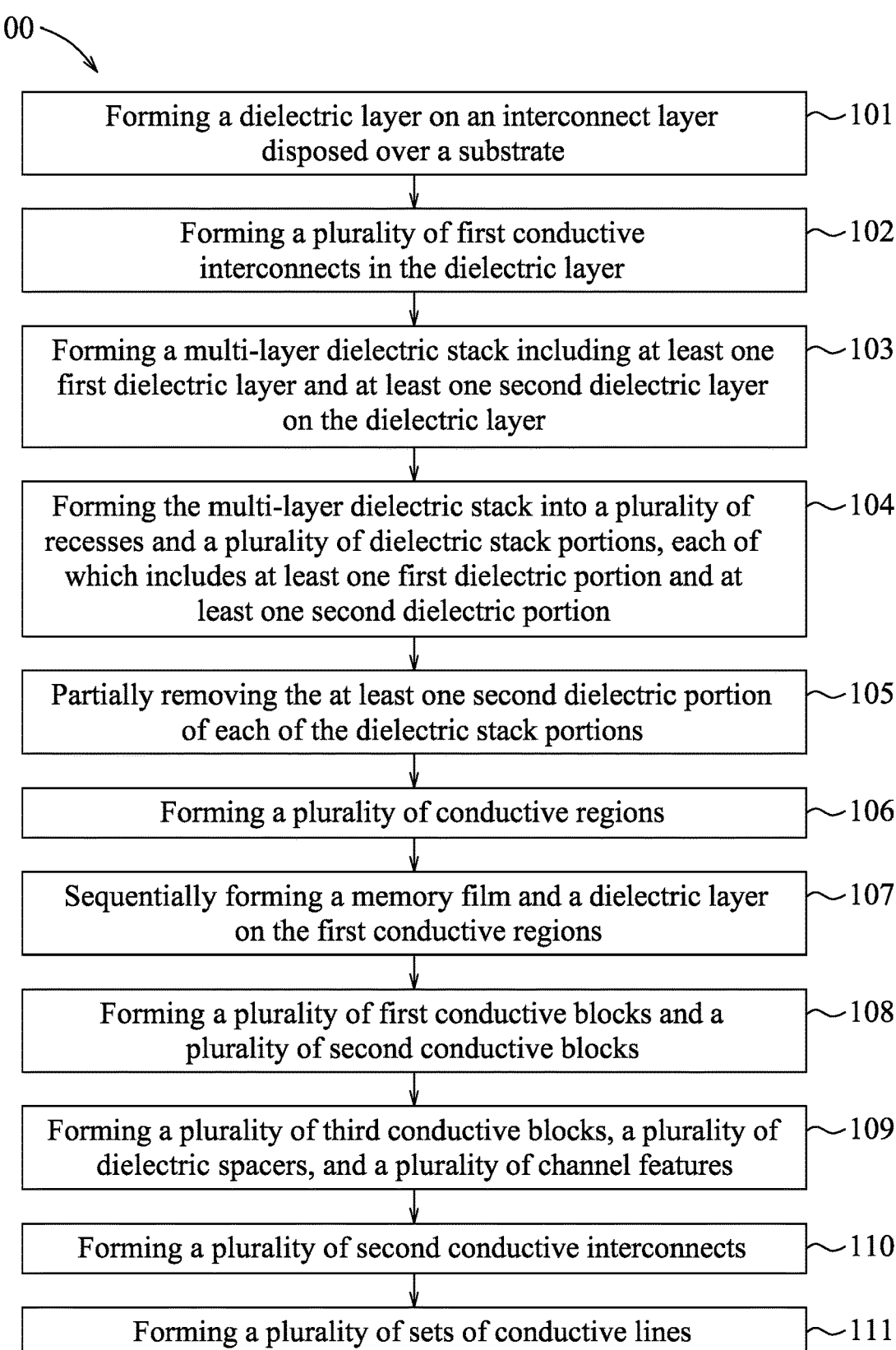

Forming a dielectric layer on an interconnect layer disposed over a substrate ~101

Forming a plurality of first conductive interconnects in the dielectric layer ~102

Forming a multi-layer dielectric stack including at least one first dielectric layer and at least one second dielectric layer on the dielectric layer ~103

Forming the multi-layer dielectric stack into a plurality of recesses and a plurality of dielectric stack portions, each of which includes at least one first dielectric portion and at least one second dielectric portion ~104

Partially removing the at least one second dielectric portion of each of the dielectric stack portions ~105

Forming a plurality of conductive regions ~106

Sequentially forming a memory film and a dielectric layer on the first conductive regions ~107

Forming a plurality of first conductive blocks and a plurality of second conductive blocks ~108

Forming a plurality of third conductive blocks, a plurality of dielectric spacers, and a plurality of channel features ~109

Forming a plurality of second conductive interconnects ~110

Forming a plurality of sets of conductive lines ~111

SEMICONDUCTOR MEMORY STRUCTURE HAVING ENHANCED MEMORY WINDOW AND METHOD FOR MANUFACTURING THE SAME

REFERENCE TO RELATED APPLICATION

This application claims priority of U.S. Provisional Application No. 63/408,215 filed on Sep. 20, 2022, the contents of which is incorporated herein by reference in its entirety.

BACKGROUND

Semiconductor memory structures (for example, but not limited to, ferroelectric field effect transistor (FeFET) memory structures) in complementary metal oxide semiconductor (CMOS) back-end-of-line (BEOL) show high speed application and low voltage operation, and by stacking the semiconductor memory structures on logic circuits, can reduce latency and chip footprint significantly. However, in order to switch memory polarization, the semiconductor memory structures might suffer from a small memory window due to less electric field between a source/bit line and a word line.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing a semiconductor device including a semiconductor memory structure having an enhanced memory window in accordance with some embodiments.

FIGS. 2A to 11A are schematic perspective views illustrating some intermediate stages of the manufacturing method as depicted in FIG. 1 in accordance with some embodiments.

FIGS. 2B to 11B are enlarged schematic side views of FIGS. 2A to 11A, respectively.

DETAILED DESCRIPTION

Figure 2A:
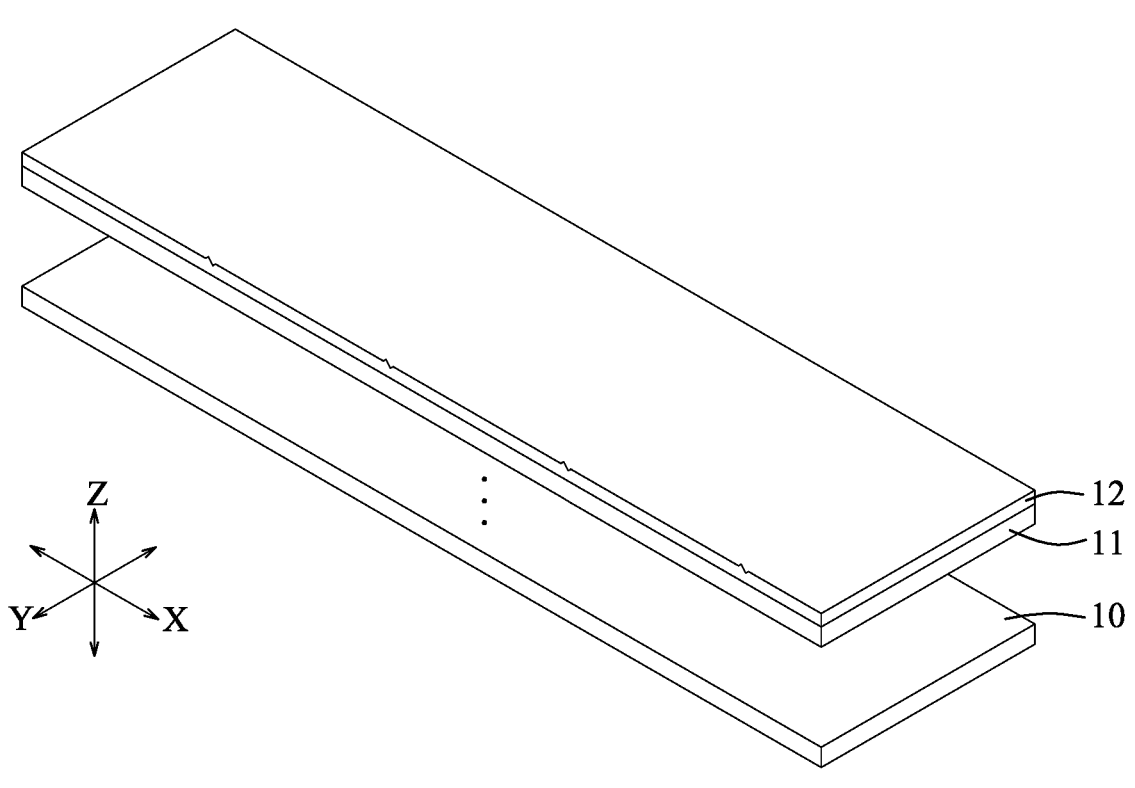

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device including a semiconductor memory structure having an enhanced memory window and a method for manufacturing the semiconductor device. FIG. 1 is a flow diagram illustrating a method 100 for manufacturing a semiconductor device including a semiconductor memory structure having an enhanced memory window in accordance with some embodiments. FIGS. 2A to 11A are schematic perspective views illustrating some intermediate stages of the manufacturing method as depicted in FIG. 1 in accordance with some embodiments, and FIGS. 2B to 11B are enlarged schematic side views of FIGS. 2A to 11A, respectively. Some repeating structures are omitted in FIGS. 2A to 11A and 2B to 11B for the sake of brevity. Additional steps can be provided before, after or during the method 100, and some of the steps described herein may be replaced by other steps or be eliminated.

Figure 2B:
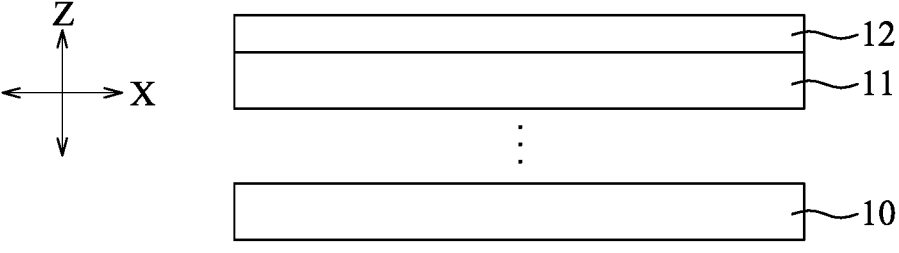

Referring to FIG. 1 and the example illustrated in FIGS. 2A and 2B, the method 100 begins at step 101, where a dielectric layer is formed on an interconnect layer disposed over a substrate. FIGS. 2A and 2B illustrate formation of a dielectric layer 12 on an interconnect layer 11, which is disposed over a substrate 10.

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure. In some embodiments, the semiconductor substrate may further include various active regions, for example, the active regions configured for an N-type metal oxide semiconductor (NMOS) transistor device or the active regions configured for a P-type metal oxide semiconductor (PMOS) transistor device. In some embodiments, the active regions may includes source/drain (S/D) regions of a transistor device. It is noted that each of the source/drain regions may refer to a source or a drain, individually or collectively dependent upon the context.

In some embodiments, the interconnect layer 11 may serve as a metal layer (Mx), and includes a dielectric layer serving as an intermetal dielectric (IMD) layer and a plurality of metal lines (not shown) which are disposed in the dielectric layer and which are spaced apart from each other.

In some embodiments, the dielectric layer 12 may include a low dielectric constant (k) dielectric material having a k value ranging from, for example, but not limited to, about 2.0 to about 5.0. In some embodiments, the dielectric layer 12 may include, for example, but not limited to, silicon oxide (SiOx), silicon nitride (SiNx), silicon carbide (SiCx), silicon carbonitride (SiCxNy), silicon carboxide (SiCxOy), hydrogenated silicon oxycarbide (SiOxCyHz), or combinations thereof. Other suitable low-k dielectric materials are within the contemplated scope of the present disclosure. In some embodiments, the dielectric layer 12 may be formed on the interconnect layer 11 by a suitable deposition process as is known in the art of semiconductor fabrication, for example, but not limited to, chemical vapor deposition (CVD), atomic layer deposition (ALD), spin coating, or the like. Other suitable deposition techniques are within the contemplated scope of the present disclosure. In some embodiments, the deposition process is conducted at a temperature ranging from about room temperature to about 425° C.

Figure 3A:
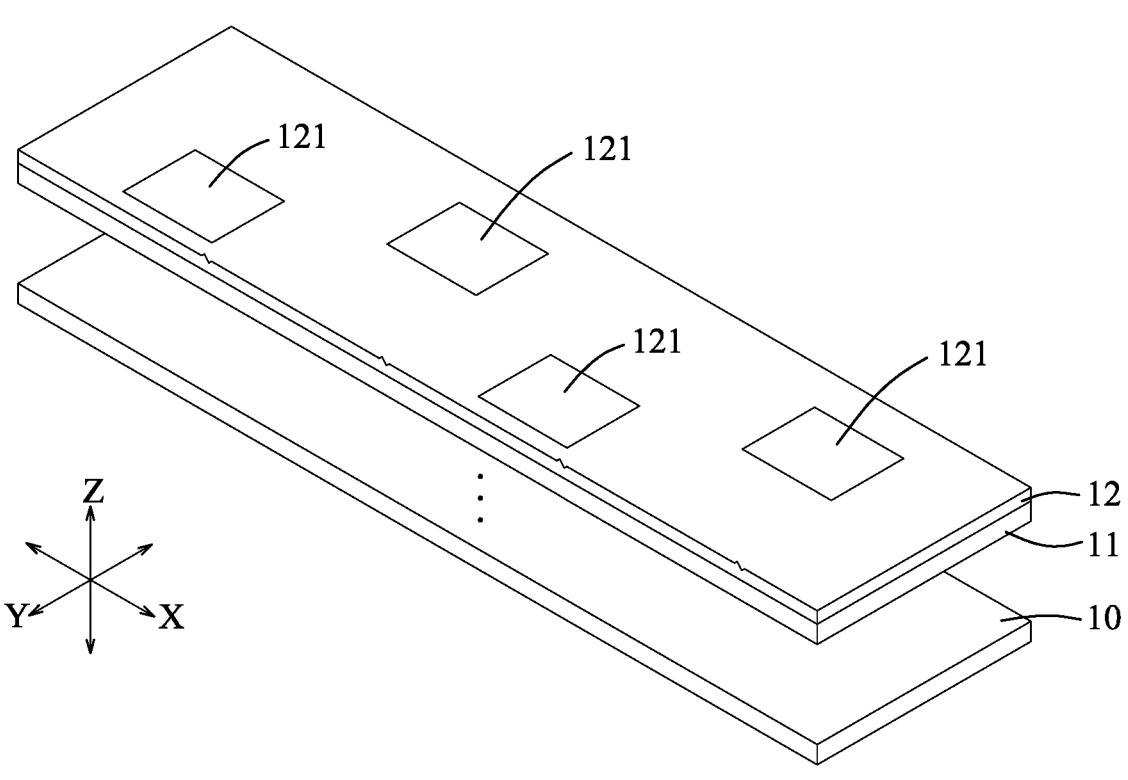
Figure 3B:
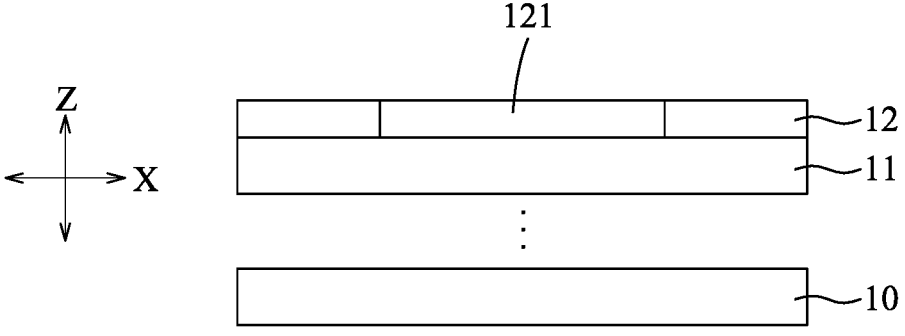

Referring to FIG. 1 and the example illustrated in FIGS. 3A and 3B, the method 100 proceeds to step 102, where a plurality of first conductive interconnects are formed in the dielectric layer. FIGS. 3A and 3B illustrate formation of a plurality of first conductive interconnects 121 in the dielectric layer 12. The first conductive interconnects 121 are separated from each other. In some embodiments, the first conductive interconnects 121 serve as bottom via contacts and are electrically connected to the metal lines of the interconnect layer 11, respectively. In some embodiments, the first conductive interconnects 121 may be formed using a single damascene process. In some embodiments, the first conductive interconnects 121 may include a metal material, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductivity. Other suitable conductive materials are within the contemplated scope of the present disclosure. Deposition of the metal material to form the first conductive interconnects 121 may be conducted by a suitable deposition process as is known to those skilled in the art of semiconductor fabrication (for example, but not limited to, CVD, ALD, physical vapor deposition (PVD), electroless deposition (ELD), electro-chemical plating (ECP), or the like) at a temperature ranging, for example, but not limited to, from about 200° C. to about 425° C.

Figure 4A:
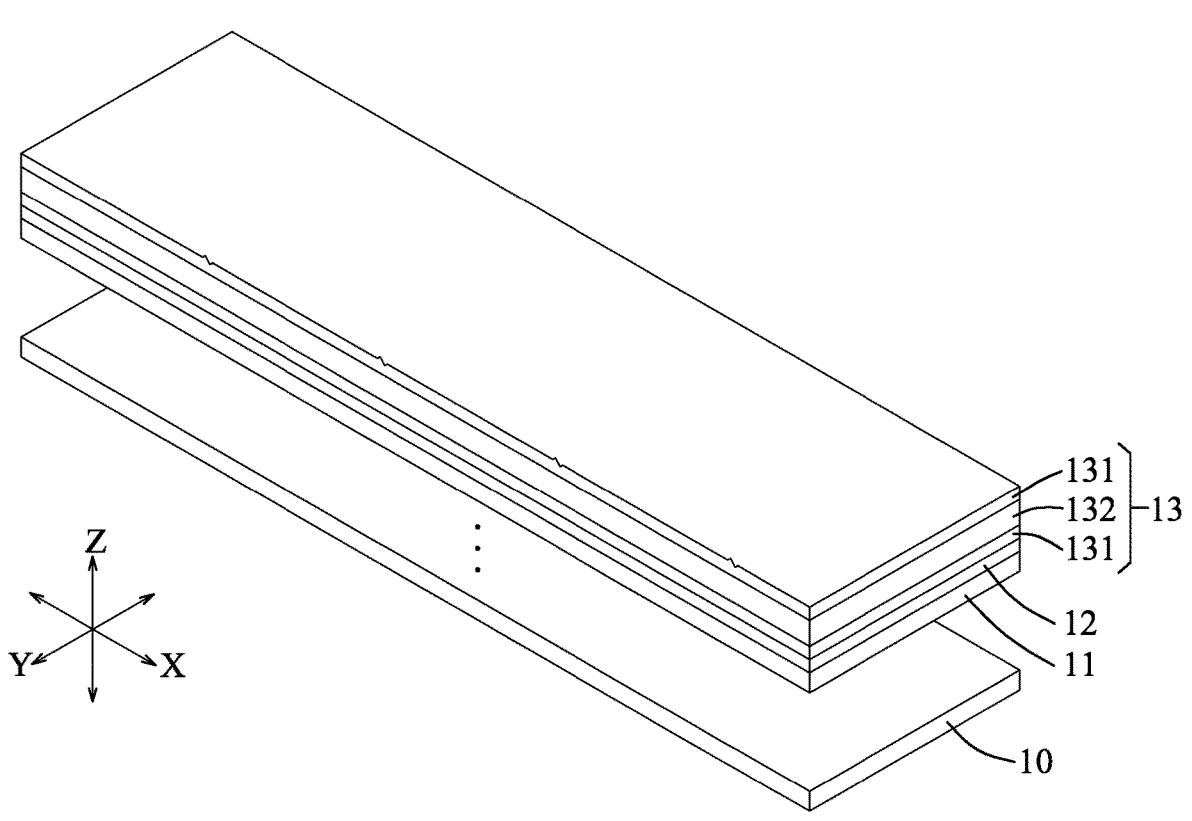
Figure 4B:
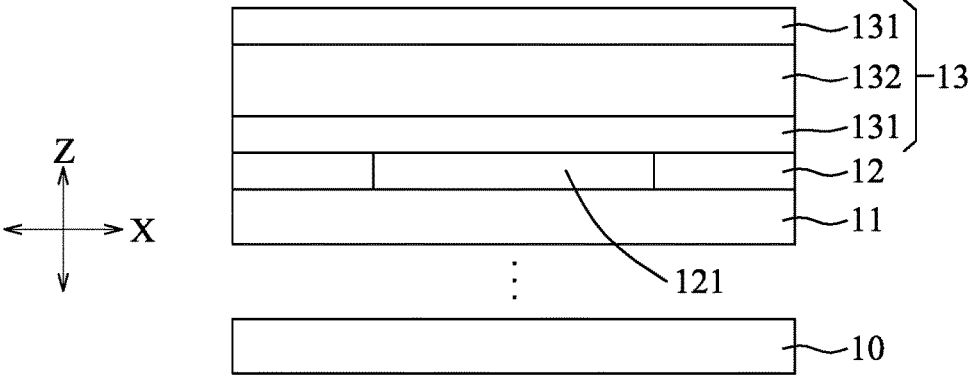

Referring to FIG. 1 and the example illustrated in FIGS. 4A and 4B, the method 100 proceeds to step 103, where a multi-layer dielectric stack is formed on the dielectric layer. FIGS. 4A and 4B illustrate formation of a multi-layer dielectric stack 13 on the dielectric layer 12. The multi-layer dielectric stack 13 includes at least one first dielectric layer 131 and at least one second dielectric layer 132. In some embodiments, the multi-layer dielectric stack 13 includes two first dielectric layers 131 and one second dielectric layer 132 interposed between the two first dielectric layers 131. In some embodiments, the multi-layer dielectric stack 13 may include a plurality of the first dielectric layers 131 and a plurality of the second dielectric layers 132, which are alternately stacked on the dielectric layer 12. In some embodiments, the first dielectric layer 131 may include a first dielectric material, and the second dielectric layer 132 may include a second dielectric material different from the first dielectric material. In some embodiments, the first dielectric layer 131 may include, for example, but not limited to, silicon oxide (SiOx), and the second dielectric layer 132 may include, for example, but not limited to, silicon nitride (SiNx). Other materials suitable for the first and second dielectric layers 131, 132 are within the contemplated scope of the disclosure. In some embodiments, the lowermost layer of the multi-layer dielectric stack 13 is the first dielectric layer 131, which is disposed to be in contact with the dielectric layer 12. In some embodiments, the first dielectric layers 131 and the second dielectric layers 132 may be formed alternatively on the dielectric layer 12 by a suitable deposition process as is known in the art of semiconductor fabrication, for example, but not limited to, CVD, ALD, spin coating, or the like. Other suitable deposition techniques are within the contemplated scope of the present disclosure.

Figure 5A:
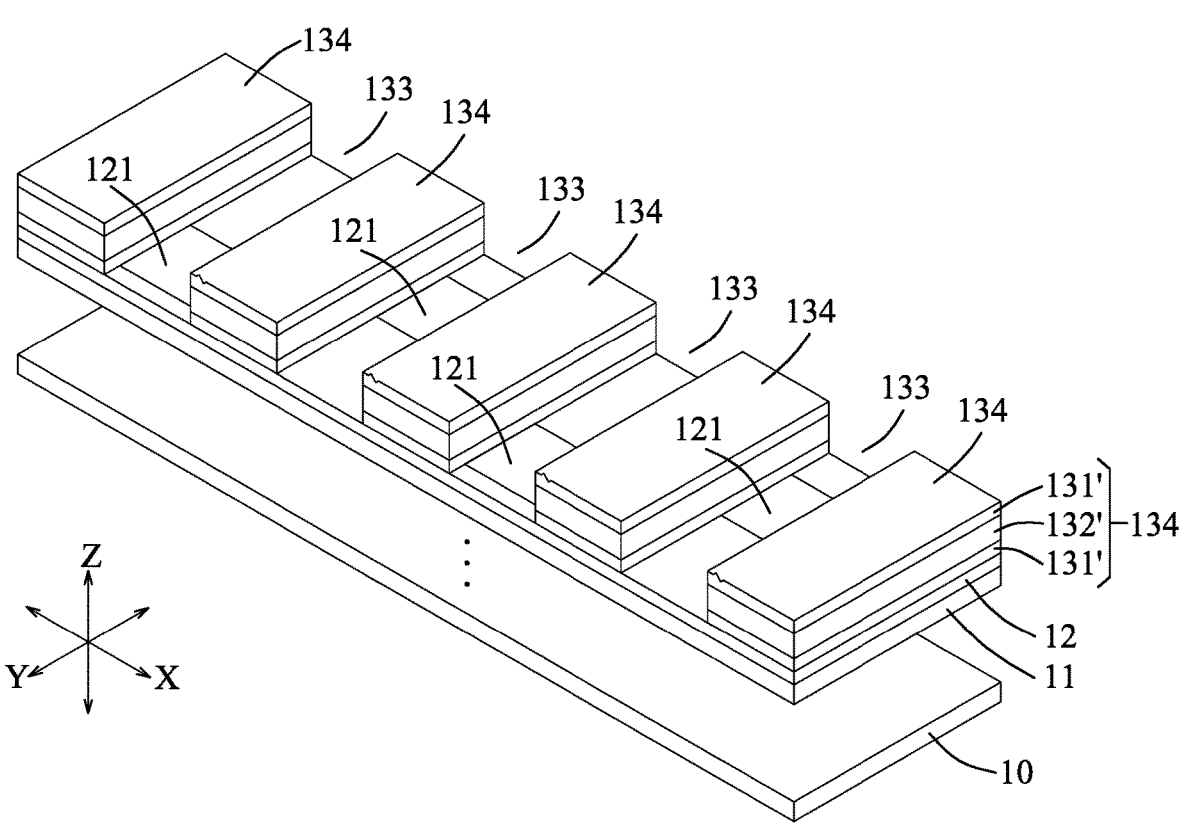
Figure 5B:
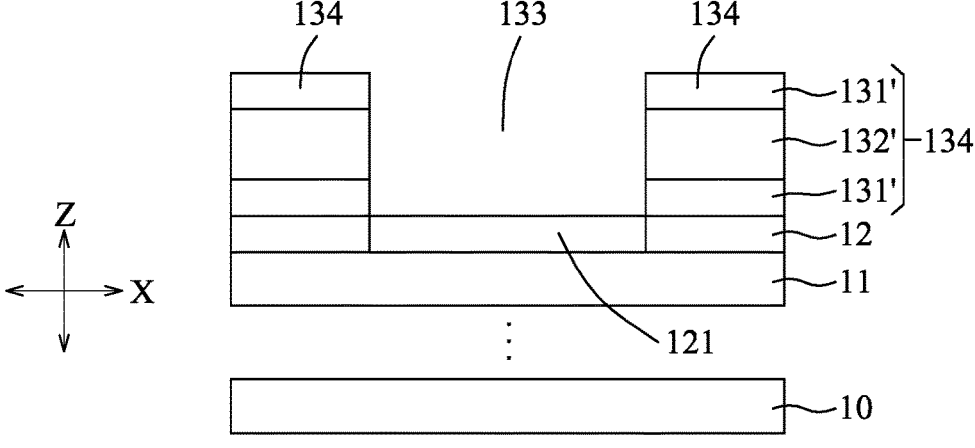

Referring to FIG. 1 and the example illustrated in FIGS. 5A and 5B, the method 100 proceeds to step 104, where the multi-layer dielectric stack is formed into a plurality of recesses and a plurality of dielectric stack portions. FIGS. 5A and 5B illustrate formation of a plurality of recesses 133 and a plurality of dielectric stack portions 134. In some embodiments, the multi-layer dielectric stack 13 shown in FIG. 4A is recessed by an anisotropic etching process to form a plurality of the recesses 133 and a plurality of dielectric stack portions 134. Adjacent two of the dielectric stack portions 134 are spaced apart from each other in an X direction by a corresponding one of the recesses 133. The recesses 133 and the dielectric stack portions 134 extend in a Y direction transverse to the X direction. The first conductive interconnects 121 are exposed from the recesses 133, respectively, in a Z direction transverse to the X and Y directions. Each of the dielectric stack portions 134 includes at least one first dielectric portion 131' and at least one second dielectric portion 132'. In some embodiments, each of the dielectric stack portions 134 includes two first dielectric portions 131' and one second dielectric portion 132' interposed between the two first dielectric portions 131'. In some embodiments, each of the dielectric stack portions 134 may include a plurality of the first dielectric portions 131' and a plurality of the second dielectric portions 132', which are alternately stacked on the dielectric layer 12. The anisotropic etching process may be a suitable anisotropic etching process, for example, but not limited to, anisotropic dry etching.

Figure 6A:
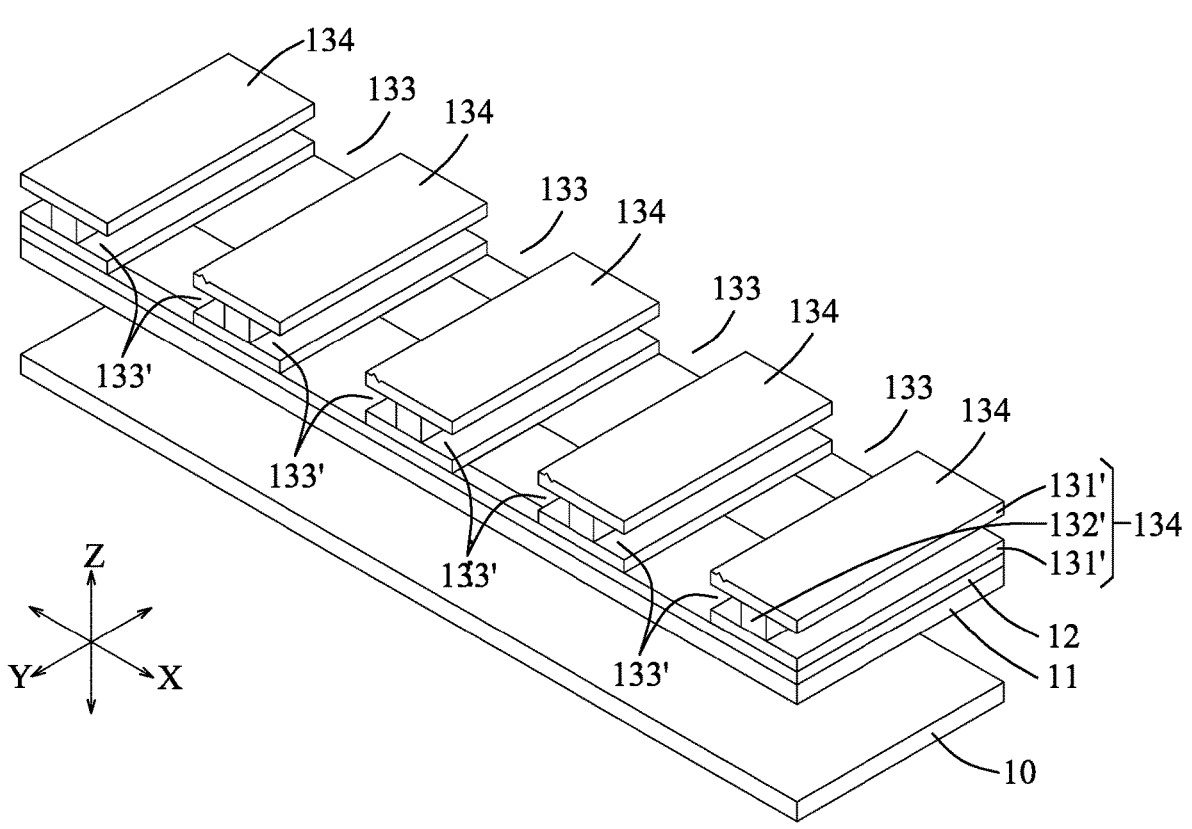
Figure 6B:
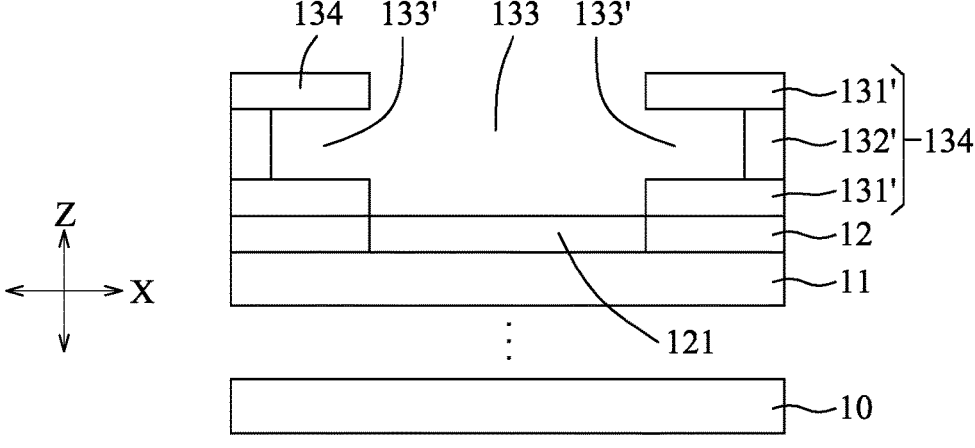

Referring to FIG. 1 and the example illustrated in FIGS. 6A and 6B, the method 100 proceeds to step 105, where the at least one second dielectric portion of each of the dielectric stack portions is partially removed. FIGS. 6A and 6B illustrate partial removal of the at least one second dielectric portion 132' of each of the dielectric stack portions 134. In some embodiments, the at least one second dielectric portion 132' is laterally recessed by an isotropic etching process (for example, but not limited to, an isotropic wet etching process) to remove two side parts of the at least one second dielectric portion 132' of each of the dielectric stack portions 134 based on a relatively high etching selectivity of the at least one second dielectric portion 132' with respect to the at least one first dielectric portion 131'. After the isotropic etching process, the second dielectric portion 132' has a dimension (a width) in the X direction less than that of the first dielectric portion 131', and two lateral recesses 133' are formed between adjacent two first dielectric portions 131' of each of the dielectric stack portions 134 and at two opposite sides of the second dielectric portion 132' disposed between the adjacent two first dielectric portions 131'.

Figure 7A:
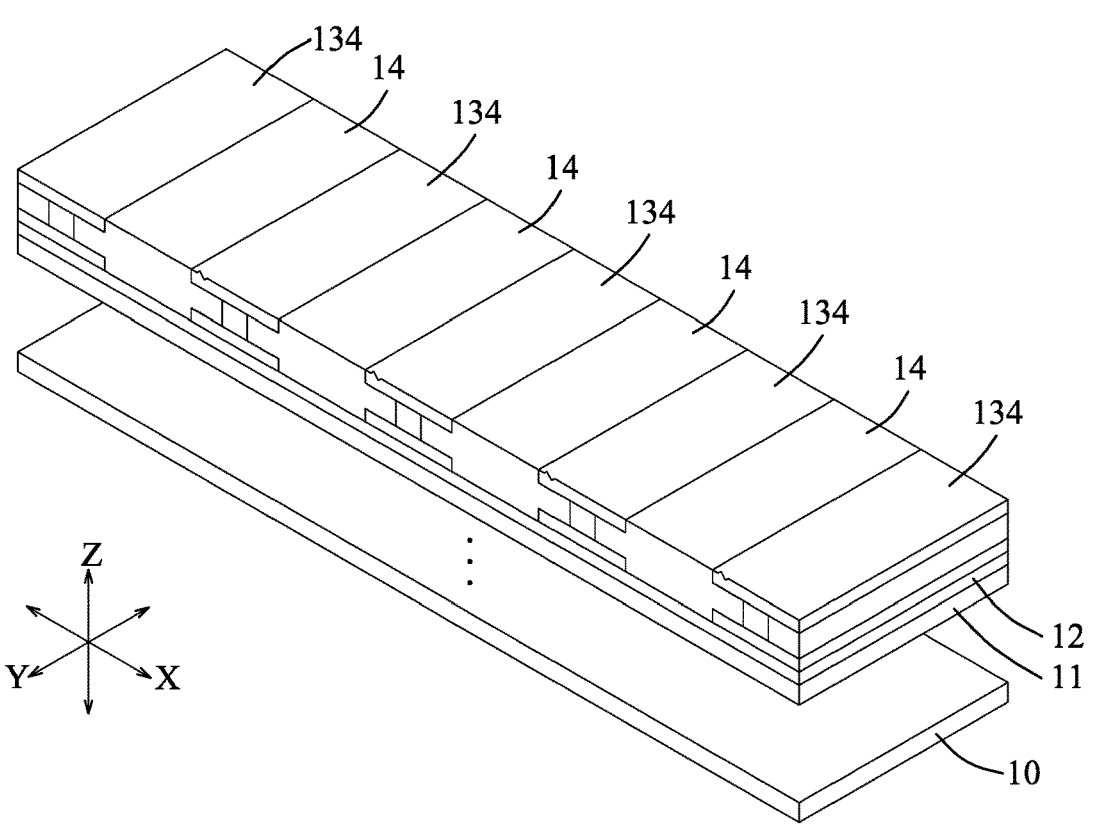
Figure 7B:
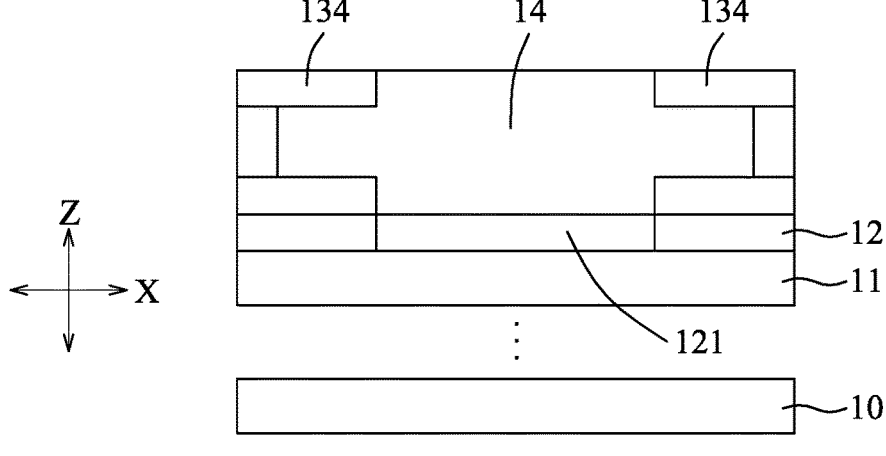

Referring to FIG. 1 and the example illustrated in FIGS. 7A and 7B, the method 100 proceeds to step 106, where a plurality of conductive regions are formed. FIGS. 7A and 7B illustrate formation of a plurality of conductive regions 14 on the dielectric layer 12. A conductive material is filled in the recesses 133 and the lateral recesses 133' shown in FIGS. 6A and 6B, and then a planarization process (for example, but not limited to, a chemical mechanical planarization (CMP) process) is conducted to remove excess of the conductive material above the dielectric stack portions 134 to form a plurality of the conductive regions 14, which extend in the Y direction. The conductive regions 14 and the dielectric stack portions 134 are disposed alternatively on the dielectric layer 12. Adjacent two of the conductive regions 14 are spaced apart from each other in the X direction by a corresponding one of the dielectric stack regions 134. Each of the dielectric stack portions 134 laterally covers a corresponding one of the conductive regions 14. The conductive regions 14 serve as word lines of a semiconductor memory structure to be formed. Each of the conductive regions 14 is electrically connected to a corresponding one of the first conductive interconnects 121.

Figures 8A, 8B:
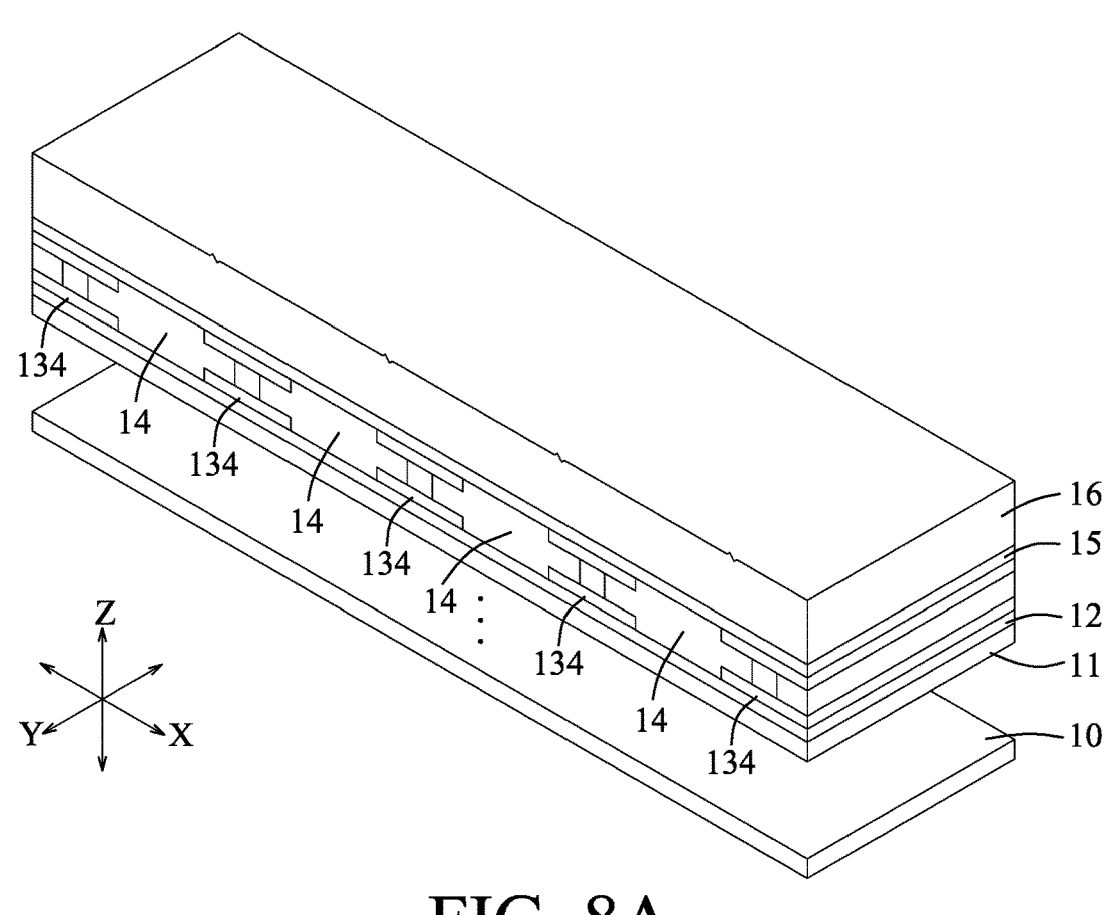

Referring to FIG. 1 and the example illustrated in FIGS. 8A and 8B, the method 100 proceeds to step 107, where a memory film and a dielectric layer are formed sequentially on the conductive regions. FIGS. 8A and 8B illustrate formation of a memory film 15 and a dielectric layer 16 sequentially on the conductive regions 14 and the dielectric stack portions 134. In some embodiments, the memory film 15 may include a high-k dielectric material. In some embodiments, the memory film 15 may include, for example, but not limited to, a ferroelectric material. In some embodiments, the ferroelectric material may be binary oxides such as hafnium oxide (hafnia, $HfO_2$), ternary oxides such as hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), ternary nitrides such as aluminum scandium nitride (AlScN), aluminum gallium nitride (AlGaN), aluminum yttrium nitride (AlYN), or the like, or quaternary oxides such as barium strontium titanate ($BaSrTiO_x$), or the like, or combinations thereof. In some embodiments, the memory film 15 may have a multi-layered structure. Other suitable materials for the memory film 15 are within the contemplated scope of the present disclosure. In some embodiments, the dielectric layer 16 may include a low-k dielectric material. In some embodiments, the dielectric layer 16 may include, for example, but not limited to, silicon oxide (SiOx), silicon nitride (SiNx), silicon carbide (SiCx), silicon carbonitride (SiCxNy), silicon carboxide (SiCxOy), hydrogenated silicon oxycarbide (SiOxCyHz), or combinations thereof. Other suitable low-k dielectric materials are within the contemplated scope of the present disclosure. In some embodiments, the dielectric layer 16 includes a dielectric material which is the same as that of the first dielectric layer 131 of the multi-layer dielectric stack 13. In some embodiments, the dielectric layer 16 may include, for example, but not limited to, silicon oxide (SiOx). In some embodiments, the memory film 15 and the dielectric layer 16 may be formed sequentially on the conductive regions 14 and the dielectric stack portions 134 by a suitable deposition technique known to those skilled in the art of semiconductor fabrication, for example, but not limited to, CVD, ALD, or the like. A planarization process (for example, but not limited to, a CMP process) may be optionally conducted to planarize an upper surface of the dielectric layer 16.

Figure 9A:
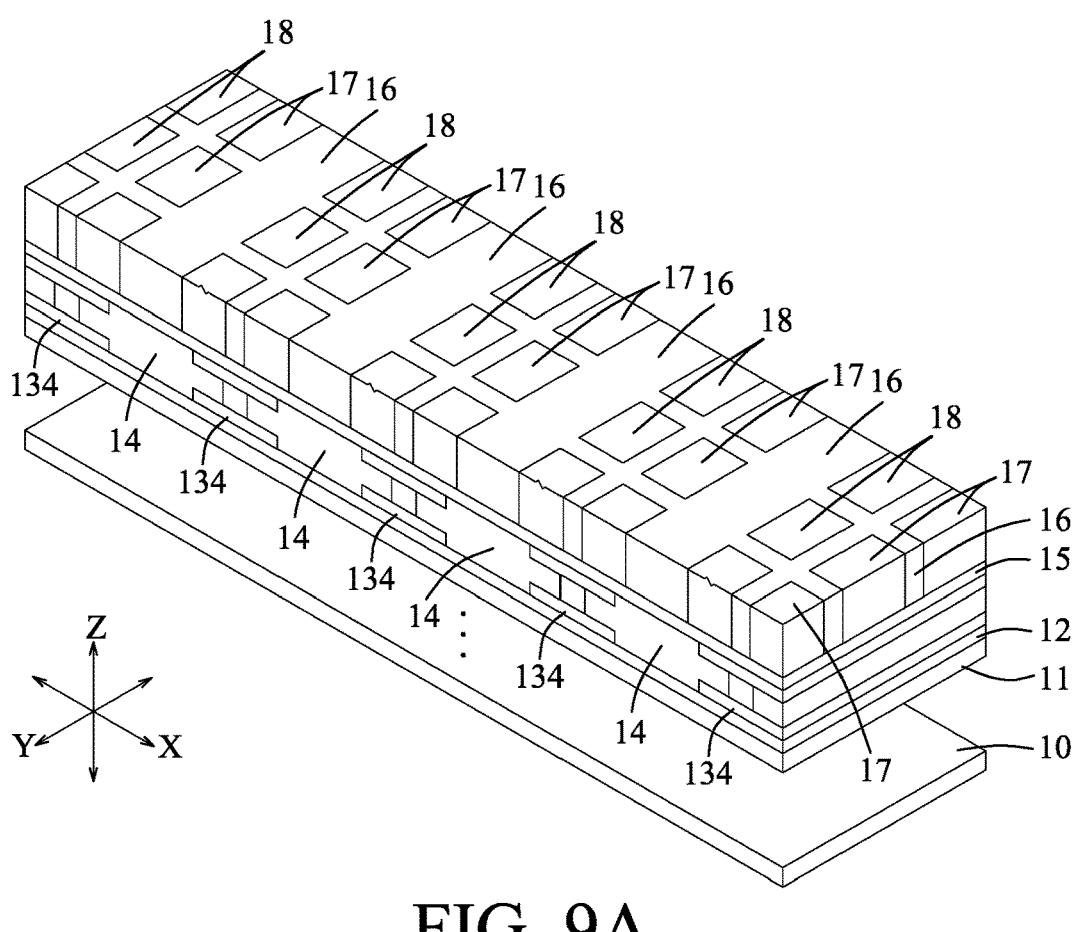
Figure 9B:
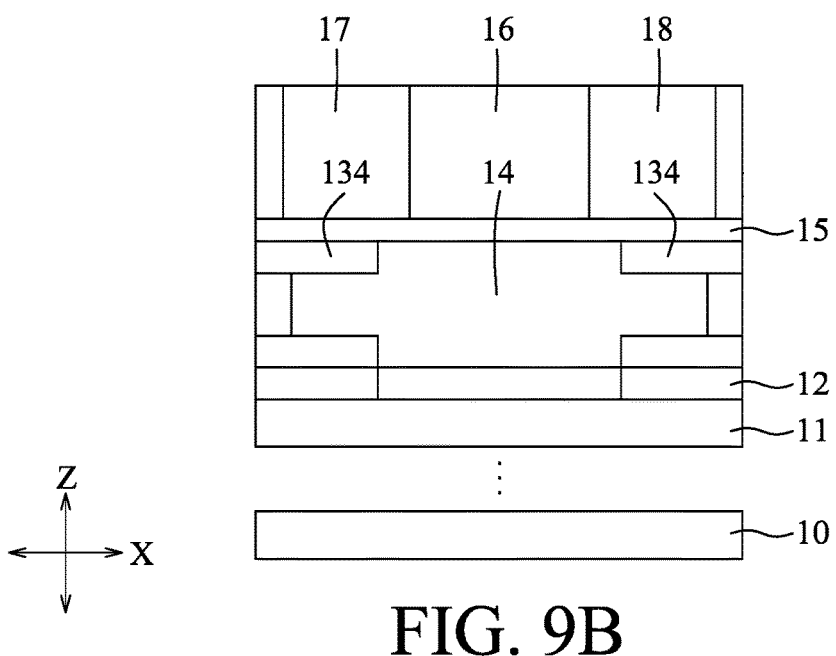

Referring to FIG. 1 and the example illustrated in FIGS. 9A and 9B, the method 100 proceeds to step 108, where a plurality of first conductive blocks and a plurality of second conductive blocks are formed. FIGS. 9A and 9B illustrate formation of a plurality of first conductive blocks 17 and a plurality of second conductive blocks 18 in the dielectric layer 16. The first conductive blocks 17 are arranged in an array, which include a plurality of columns of the first conductive blocks 17 spaced part from each other in the X direction. In each column of the first conductive blocks 17, the first conductive blocks 17 are spaced apart from each other in the Y direction. The second conductive blocks 18 are arranged in an array, which includes a plurality of columns of the second conductive blocks 18 spaced part from each other in the X direction. In each column of the second conductive blocks 18, the second conductive blocks 18 are spaced apart from each other in the Y direction. The plurality of columns of the second conductive blocks 18 are disposed to alternate with and separate from the plurality of columns of the first conductive blocks 17. In some embodiments, the first and second conductive blocks 17, 18 may include a metal material, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductivity. Other suitable conductive materials are within the contemplated scope of the present disclosure. In some embodiments, the first conductive blocks 17 and the second conductive blocks 18 may be formed together by the following steps.

The dielectric layer 16 is patterned using a suitable etching process, for example, but not limited to, a wet etching process, a dry etching process, or the like, to form a plurality of first openings (not shown) and a plurality of second openings (not shown) extending downwardly from an upper surface of the dielectric layer 16 to terminate at the memory film 15. The first openings are arranged in an array and are formed in positions the same as those of the first conductive blocks 17 to be formed, respectively. The second openings are arranged in an array and are formed in positions the same as those of the second conductive blocks 18 to be formed, respectively. The conductive material is then filled in the first and second openings, and a planarization process (for example, but not limited to, a CMP process) is conducted to remove excess of the conductive material above the dielectric layer 16.

Figures 10A, 10B:
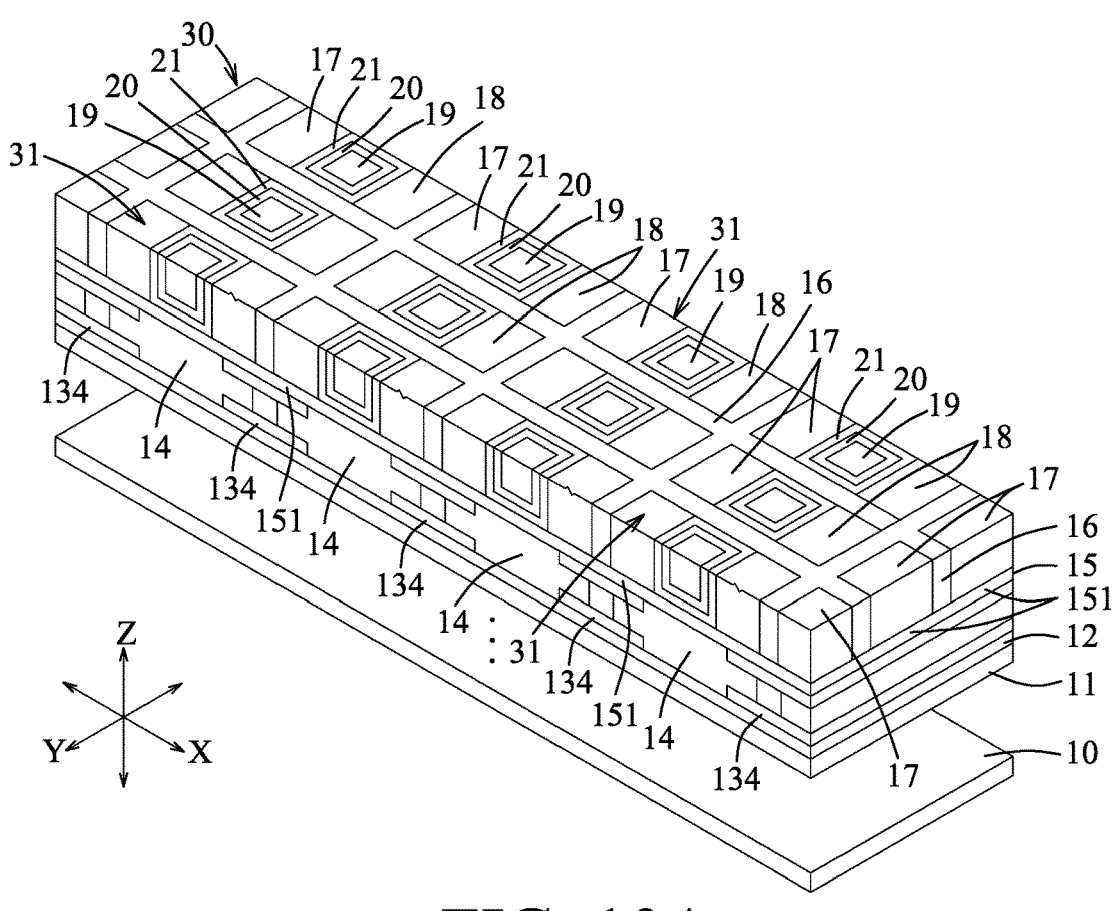

Referring to FIG. 1 and the example illustrated in FIGS. 10A and 10B, the method 100 proceeds to step 109, where a plurality of third conductive blocks, a plurality of dielectric spacers, and a plurality of channel features formed. FIGS. 10A and 10B illustrate formation of a plurality of third conductive blocks 19, a plurality of dielectric spacers 20, and a plurality of channel features 21 in the dielectric layer 16, such that a semiconductor memory structure 30 is formed. The third conductive blocks 19 are arranged in an array, which includes a plurality of columns of the third conductive blocks 19 spaced part from each other in the X direction. In each column of the third conductive blocks 19, the third conductive blocks 19 are spaced apart from each other in the Y direction. Each column of the third conductive blocks 19 is disposed between and spaced apart from a corresponding column of the first conductive blocks 17 and a corresponding column of the second conductive blocks 18 in the X direction. Each of the third conductive blocks 19 is disposed between and spaced apart from a corresponding one of the first conductive blocks 17 and a corresponding one of the second conductive blocks 18 in the X direction. The dielectric spacers 20 are arranged in an array, which include a plurality of columns of the dielectric spacers 20 spaced part from each other in the X direction. In each column of the dielectric spacers 20, the dielectric spacers 20 are spaced apart from each other in the Y direction. Each of the dielectric spacers 20 is disposed to cover a bottom surface and a lateral surface of a corresponding one of the third conductive blocks 19 and to separate the corresponding one of the third conductive blocks 19 from a corresponding one of the first conductive blocks 17 and a corresponding one of the second conductive blocks 18. The channel features 21 are arranged in an array, which include a plurality of columns of the channel features 21 spaced apart from each other in the X direction. In each column of the channel features 21, the dielectric spacers 21 are spaced apart from each other in the Y direction. Each of the channel features 21 is disposed to cover a bottom surface and a lateral surface of a corresponding one of the dielectric spacers 20 and to separate the corresponding one of the dielectric spacers 20 from a corresponding one of the first conductive blocks 17 and a corresponding one of the second conductive blocks 18. In some embodiments, the third conductive blocks 19, the dielectric spacers 20, and the channel features 21 may be formed by the following steps.

The dielectric layer 16 is patterned using a suitable etching process, for example, but not limited to, a wet etching process, a dry etching process, or the like, to form a plurality of third openings extending downwardly from an upper surface of the dielectric layer 16 to terminate at the memory film 15. The third openings are arranged in an array. Each of the third openings is formed in a position such that a lateral surface of a corresponding one of the first conductive blocks 17 and a lateral surface of a corresponding one of the second conductive blocks 18 facing the lateral surface of the corresponding one of the first conductive blocks 17 are exposed.

A channel layer and a dielectric layer are deposited conformally and sequentially and a conductive material is then filled in the third openings. Conformal deposition of the channel layer and the dielectric layer and filling of the conductive material may be conducted by a suitable deposition technique known to those skilled in the art of semiconductor fabrication, for example, but not limited to, CVD, ALD, PVD, PECVD, or the like. Thereafter, a planarization process (for example, but not limited to, a CMP process) is conducted to remove excesses of the channel layer, the dielectric layer, and the conductive material above the dielectric layer 16.

In some embodiments, the channel layer may be made of various semiconductor material. In some embodiments, the material for making the channel layer may include, for example, but not limited to, polysilicon, an indium-comprising material, such as $In_{x1}Ga_{x2}Zn_{x3}M_{x4}O$, where M may be Ti, Al, Ag, Si, Sn, W, or the like, and x1, x2, x3 and x4 may each be any value between 0 and 1, or the like, or combinations thereof. In some embodiments, the channel layer may be formed as a single layer having one of the aforesaid materials. In some alternative embodiments, the channel layer may be formed as a laminate structure having at least two of the aforesaid materials in various constitutions. In some embodiments, the channel layer may be doped with a dopant to achieve extra stability. Other suitable materials for the channel layer are within the contemplated scope of the present disclosure.

In some embodiment, the dielectric layer for forming the dielectric spacers 20 may include, for example, but not limited to, silicon oxide (SiOx), silicon nitride (SiNx), silicon carbide (SiCx), silicon carbonitride (SiCxNy), silicon carboxide (SiCxOy), hydrogenated silicon oxycarbide (SiOxCyHz), or combinations thereof. Other suitable dielectric materials are within the contemplated scope of the present disclosure. In some embodiments, the dielectric layer may be a low-k dielectric material having a k value ranging from, for example, but not limited to, about 2.0 to about 5.0.

In some embodiments, the conductive material for forming the third conductive blocks 19 may be the same as or similar to those of the first and second conductive blocks 17, 18, and thus details thereof are omitted for the sake of brevity.

Figure 11A:
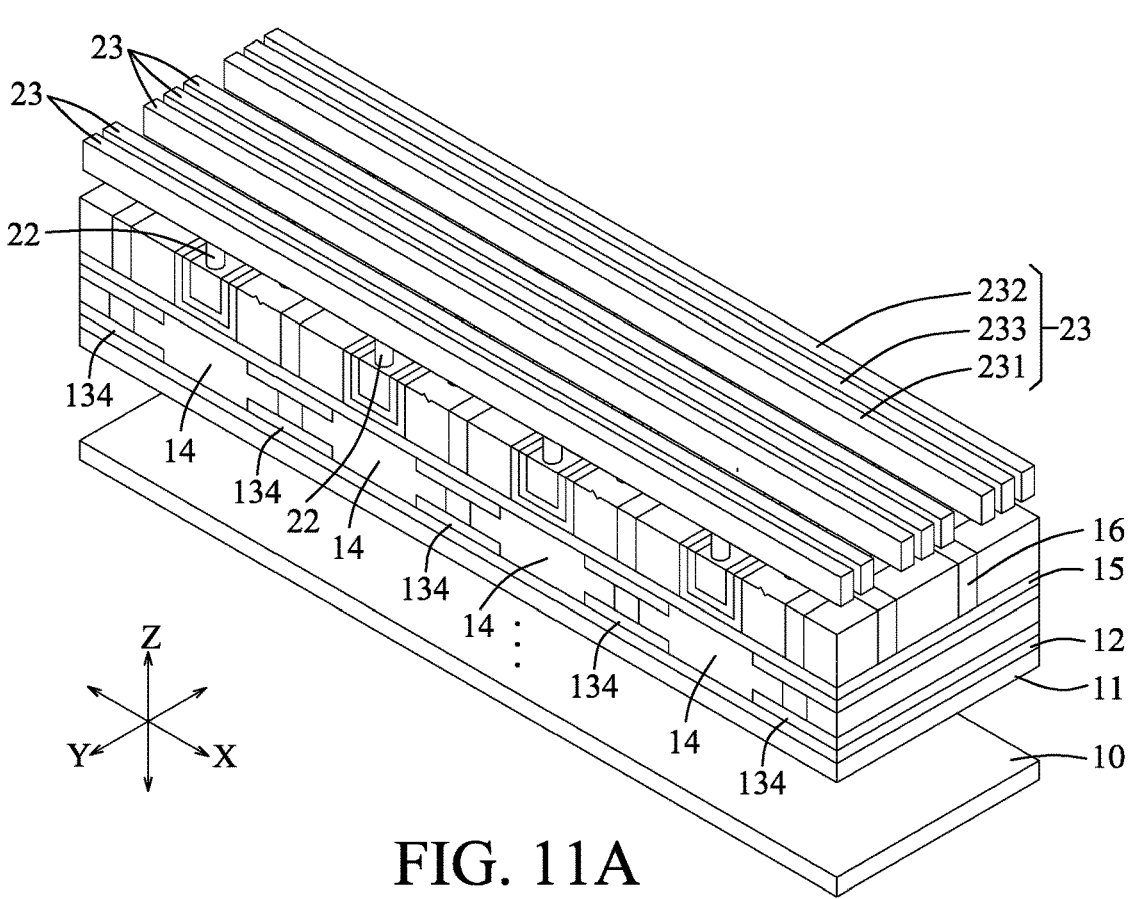
Figure 11B:
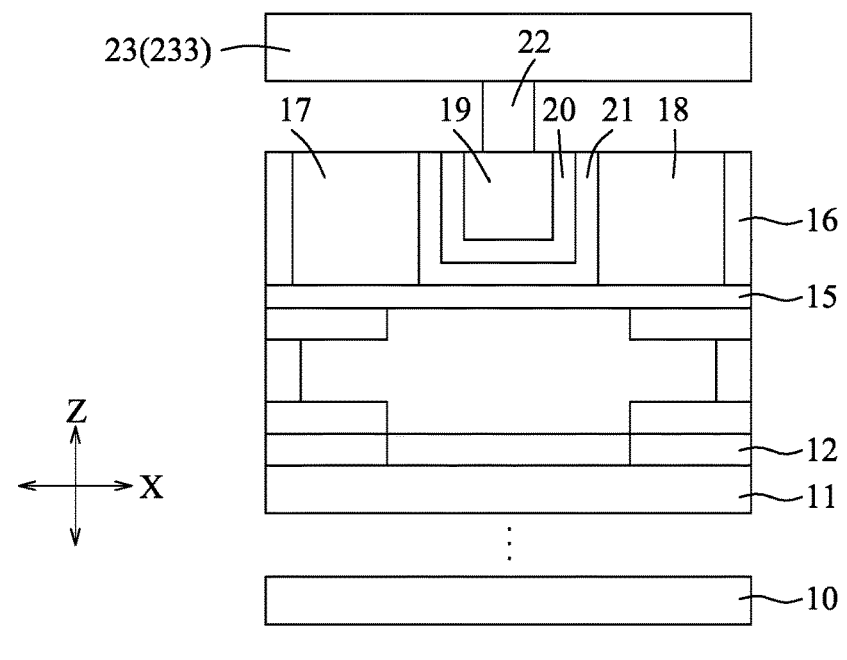

Referring to FIG. 1 and the example illustrated in FIGS. 11A and 11B, the method 100 proceeds to step 110, where a plurality of second conductive interconnects are formed, and step 111, where a plurality of sets of conductive lines are formed. FIGS. 11A and 11B illustrate formation of a plurality of second conductive interconnects 22 and a plurality of sets of conductive lines 23. A plurality of the second conductive interconnects 22 are formed in a dielectric layer (not shown), and are spaced apart from each other. The second conductive interconnects 22 extend in the Z direction, and serve as top via contacts. The conductive lines 23 serve as metal lines, and are formed in a dielectric layer (not shown) serving as an IMD layer. The conductive lines 23 extend in the X direction, and are spaced apart from each other in the Y direction. Each set of the conductive lines 23 includes a first conductive line 231 electrically connected to a corresponding one of the first conductive blocks 17 through a corresponding one of the second conductive interconnects 22, a second conductive line 232 electrically connected to a corresponding one of the second conductive blocks 18 through a corresponding one of the second conductive interconnects 22, and a third conductive line 233 electrically connected to a corresponding one of the third conductive blocks 19 through a corresponding one of the second conductive interconnects 22. The formation and the material of the second conductive interconnects 22 are the same as or similar to those of the first conductive interconnects 121 described above with reference to FIGS. 3A and 3B, and thus details thereof are omitted for the sake of brevity. The formation and the material of the conductive lines 23 are the same as or similar to those of the conductive regions 14 described above with reference to FIGS. 7A and 7B, and thus details thereof are omitted for the sake of brevity.

Referring to the example illustrated in FIGS. 10A and 10B, the semiconductor memory structure 30 includes a plurality of memory cells 31 (e.g., thin film transistors (TFTs)) arranged in an array, which includes a plurality of columns of the memory cells 31 spaced apart from each other in the X direction. In each column of the memory cells 31, the memory cells 31 are spaced apart from each other in the Y direction. As the semiconductor memory structure 30 includes a plurality of the memory cells 31, each of the conductive regions 14 serves as a word line, which has a plurality of word line portions connected to one another in the Y direction. Each of the word line portions serves as a gate electrode of a corresponding one of the memory cells 31. Each of the first conductive blocks 17 serves as a first source/drain electrode of a corresponding one of the memory cells 31. Each of the second conductive blocks 18 serves as a second source/drain electrode of a corresponding one of the memory cells 31. Each of the third conductive blocks 19 is disposed between and separated from a corresponding one of the first conductive blocks 17 and a corresponding one of the second conductive blocks 18, and serves as an assistant gate electrode of a corresponding one of the memory cells 31. Each of the channel features 21 serves as a channel of a corresponding one of the memory cells 31, and is disposed to be in contact with a corresponding one of the first conductive blocks 17 and a corresponding one of the second conductive blocks 18 and to separate the corresponding one of the first conductive blocks 17 and the corresponding one of the second conductive blocks 18 from a corresponding one of the third conductive blocks 19. Each of the dielectric spacers 20 is disposed to surround and laterally cover a corresponding one of the third conductive blocks 19 and to separate the corresponding one of the third conductive blocks 19 from a corresponding one of the channel features 21. The memory film 15 includes a plurality of memory regions 151 arranged in an array, which includes a plurality of columns of the memory regions 151 displaced from one another in the X direction. In each column of the memory regions 151, the memory regions 151 are displaced from one another in the Y direction. Each of the memory regions 151 serves as a gate dielectric to electrically isolate a corresponding one of the word line portions (i.e., the gate electrodes) from a corresponding one of the first conductive blocks 17 (i.e., the first source/drain electrodes), a corresponding one of the second conductive blocks 18 (i.e., the second source/drain electrodes), a corresponding one of the third conductive blocks 19 (i.e., the assistant gate electrodes), and a corresponding of the channel features 21 (i.e., the channels) in a corresponding one of the memory cells 31. In other words, each of the memory regions 151 is disposed such that a corresponding one of the word line portions is located on a first surface of the each of the memory regions 151 and such that a corresponding one of the first conductive blocks 17, a corresponding one of the second conductive blocks 18, a corresponding one of the third conductive blocks 19, and a corresponding of the channel features 21 are located on a second surface of the each of the memory regions 151 opposite to the first surface.

Referring to the example illustrated in FIGS. 11A and 1B, in each set of the conductive lines 23, one of the first conductive line 231 and the second conductive line 232 serves as a global source line, the other one of the first conductive line 231 and the second conductive line 232 serves as a global bit line, and the third conductive line 233 serves as a global assistant gate line.

During a writing operation, the memory region 151 of each of the memory cells 31 can be switched to one of a first polarization state and a second polarization state by applying suitable voltages to a corresponding one of the word lines (i.e., a corresponding one of the conductive regions 14), a corresponding one of the first source/drain electrodes (i.e., a corresponding one of the first conductive blocks 17), a corresponding one of the second source/drain electrodes (i.e., a corresponding one of the second conductive blocks 18), and a corresponding one of the assistant gate electrodes (i.e., a corresponding one of the third conductive blocks 19), such that an electric field (as shown by arrows in FIG. 10B) is generated between the corresponding one of the word lines and the corresponding one of the first source/drain electrodes, between the corresponding one of the word lines and the corresponding one of the second source/drain electrodes, and between the corresponding one of the word lines and the corresponding one of the assistant gate electrodes. The electric field may shift a turn-on threshold voltage of the each of the memory cells 31.

Figure 12:
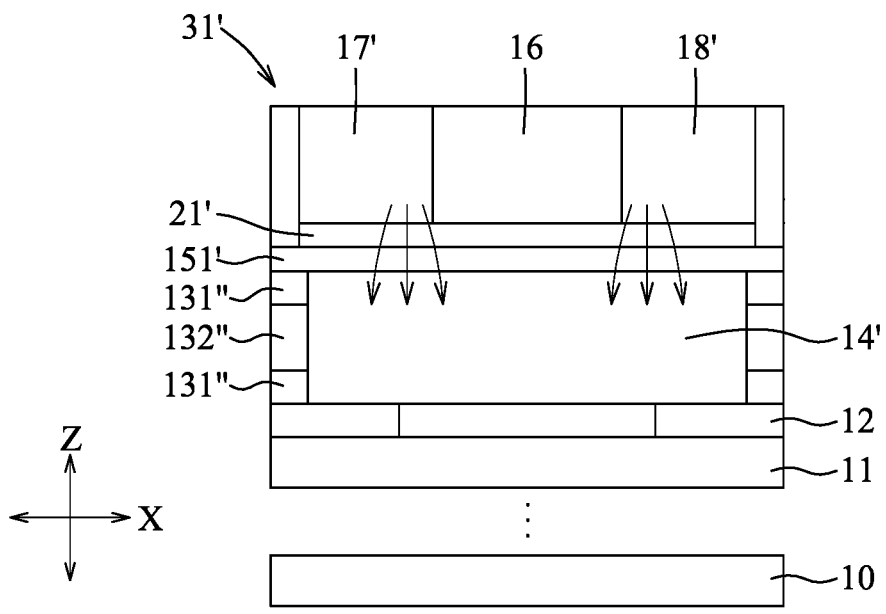
FIG. 12 is an enlarged schematic side view of a semiconductor device including a semiconductor memory structure.

Referring to the example illustrated in FIG. 12, a memory structure includes a plurality of memory cells 31' arranged in an array. One of the memory cells 31' is shown in FIG. 12. The memory cell 31' has a configuration similar to that of the memory cell 31 of the semiconductor memory structure 30 of the present disclosure as illustrated in FIGS. 10A and 10B except the following differences. The memory cell 31' does not include the assistant gate electrode (i.e., the third conductive block 19) and the dielectric spacer 20, which are included in each of the memory cells 31 of the semiconductor memory structure 30 of the present disclosure. A second dielectric portion 132" is not laterally recessed by an isotropic etching process, such that a lateral surface of the second dielectric portion 132" is aligned with that of a first dielectric portion 131". A channel feature 21' is configured in a flat film disposed on a memory region 151' to separate the memory region 151' from a first conductive block 17' serving as a first source/drain electrode and a second conductive block 18' serving as a second source/drain electrode.

As shown in FIG. 12, during a writing operation, the memory region 151' of the memory cell 31' can be switched to one of a first polarization state and a second polarization state by applying suitable voltages to a word line (i.e., a conductive region 14'), the first source/drain electrode (i.e., the first conductive block 17') and the second source/drain electrode (i.e., the second conductive blocks 18'), such that an electric field (as shown by arrows in FIG. 12) is generated between the word line and the first source/drain electrode and between the word line and the second source/drain electrode. A distribution area of the electric field generated in each of the memory cells 31, as shown by the arrows in FIG. 10B, is relatively greater than a distribution area of the electric field generated in the memory cell 31'. Therefore, each of the memory cells 31 has a memory window which is greater than that of the memory cell 31' such that application speed of each of the memory cells 31 can be enhanced. In addition, as shown in FIGS. 10B and 12, in each of the memory cells 31, an overlapping area between a word line (i.e., a corresponding one of the conductive regions 14) and a corresponding one of the first source/drain electrode (i.e., a corresponding one of the first conductive blocks 17) and an overlapping area between the word line (i.e., the corresponding one of the conductive regions 14) and a corresponding one of the second source/drain electrode (i.e., a corresponding one of the second conductive blocks 18) are less than that between the word line (i.e., the conductive region 14') and the first source/drain electrode (i.e., the first conductive block 17') and that between the word line (i.e., the conductive region 14') and the second source/drain electrode (i.e., the second conductive block 18'). Therefore, each of the memory cells 31 may have a capacitance less than that of the memory cell 31', such that a resistance-capacitance delay of each of the memory cells 31 is smaller than that of the memory cell 31'.

Figure 13:
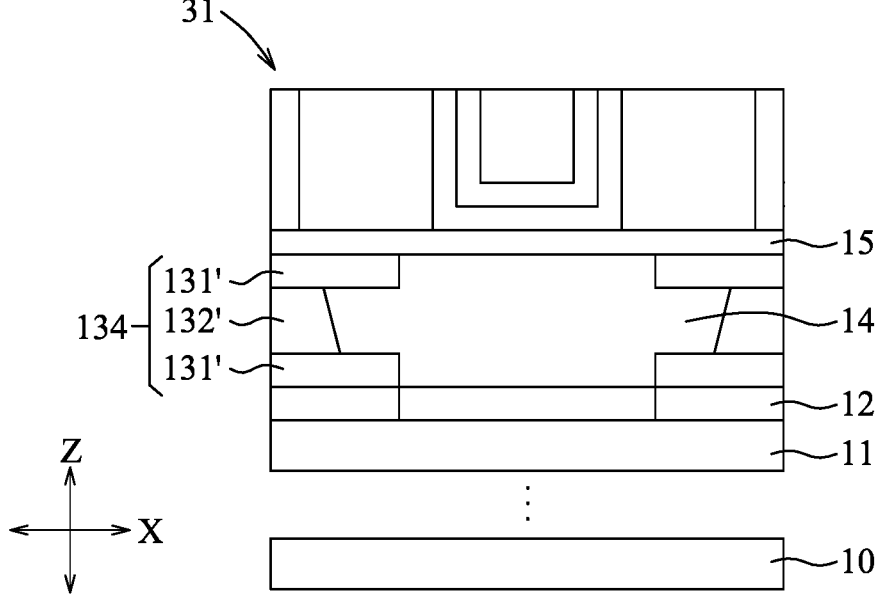
FIGS. 13 to 21 are enlarged schematic side views each illustrating a semiconductor device including a semiconductor memory structure having an enhanced memory window in accordance with some embodiments.
Figure 14:
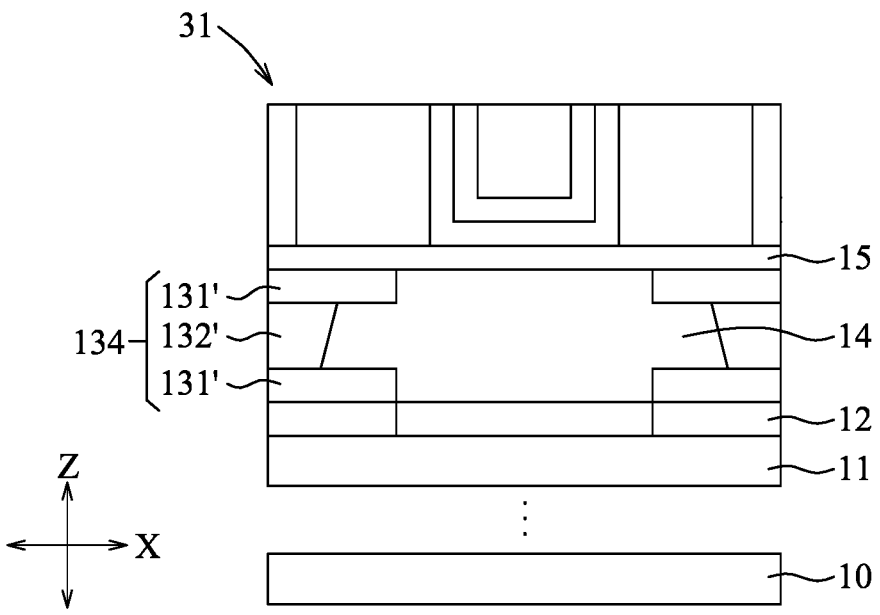
Figure 15:
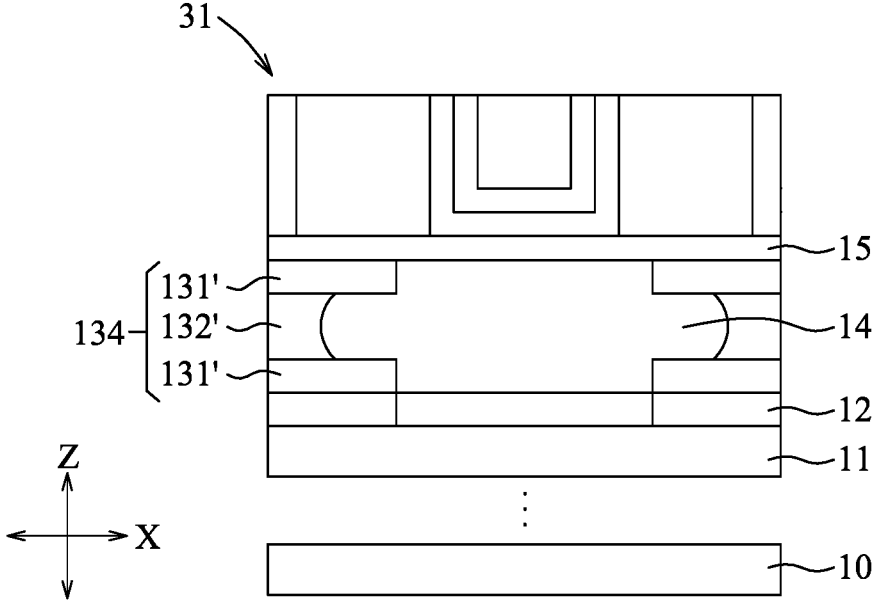
Figure 17:
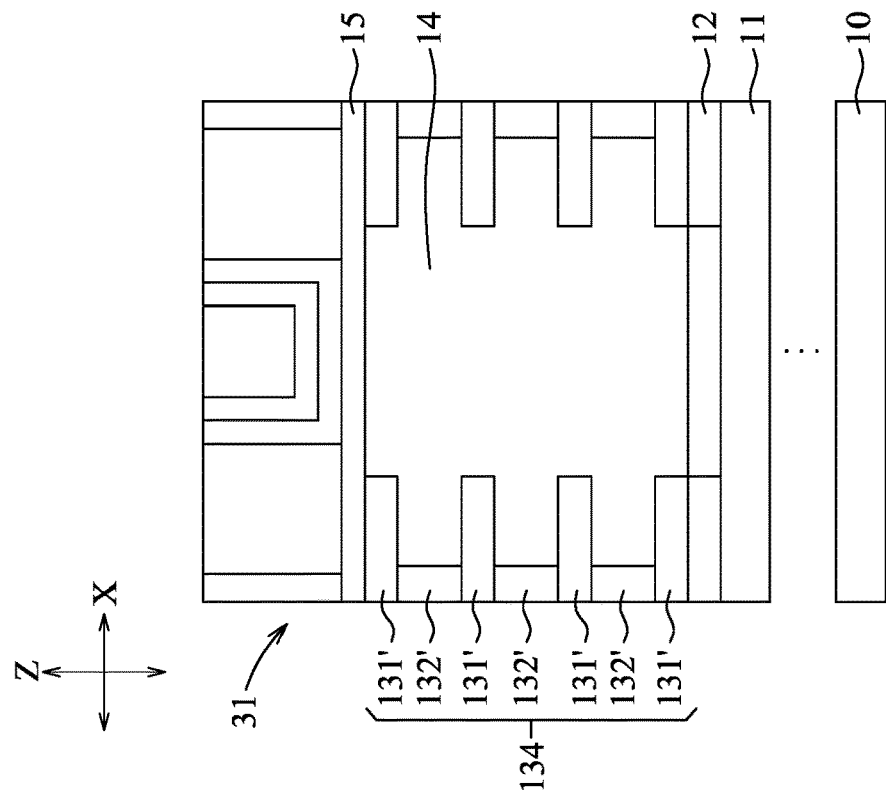
Figure 16:
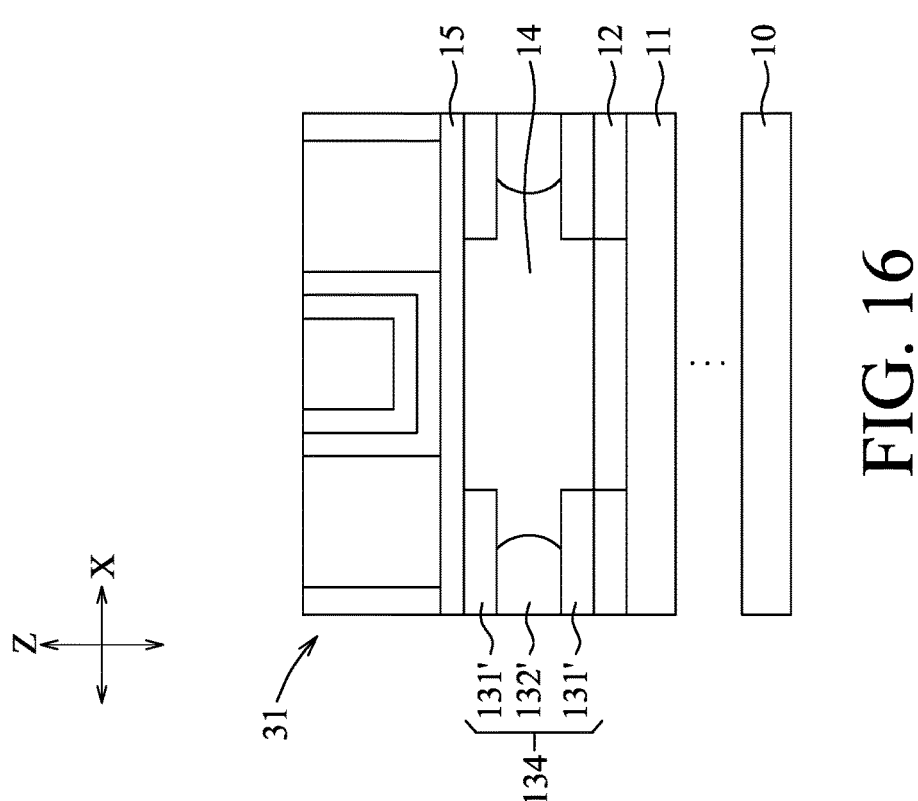
Figure 19:
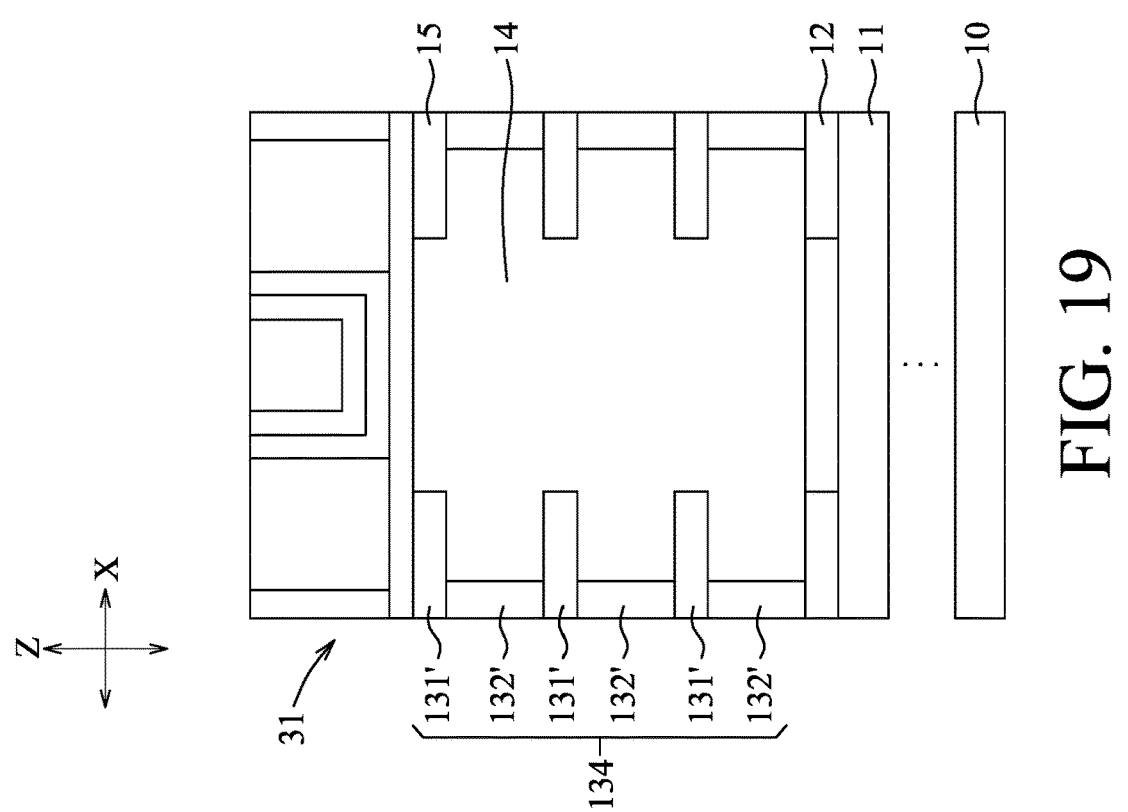
Figure 18:
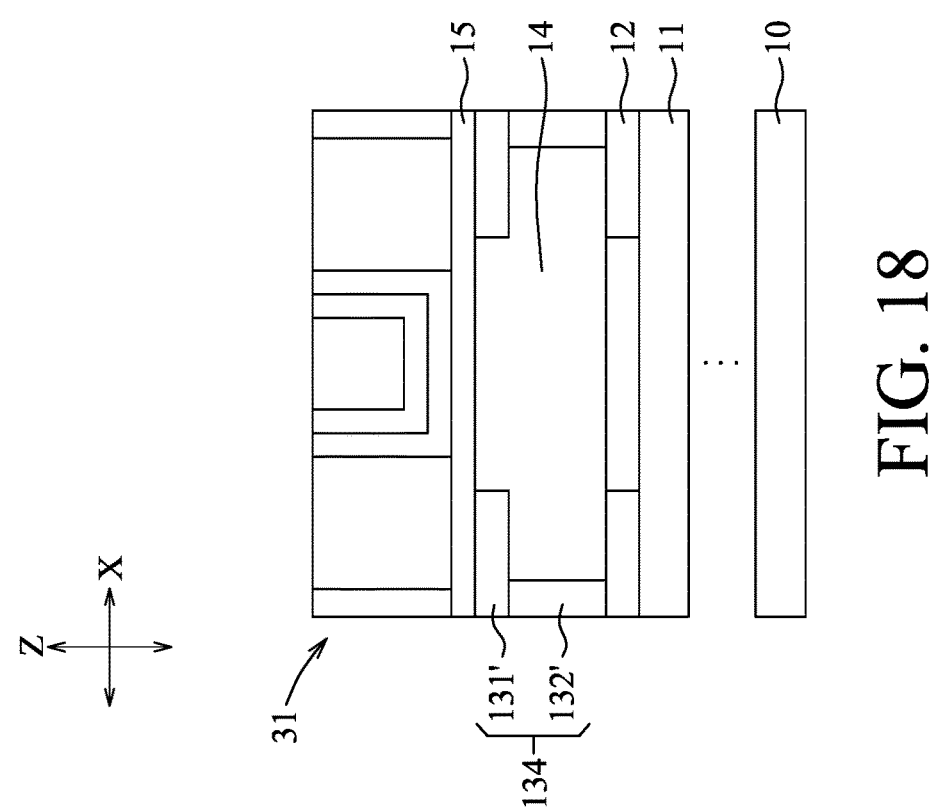
Figure 21:
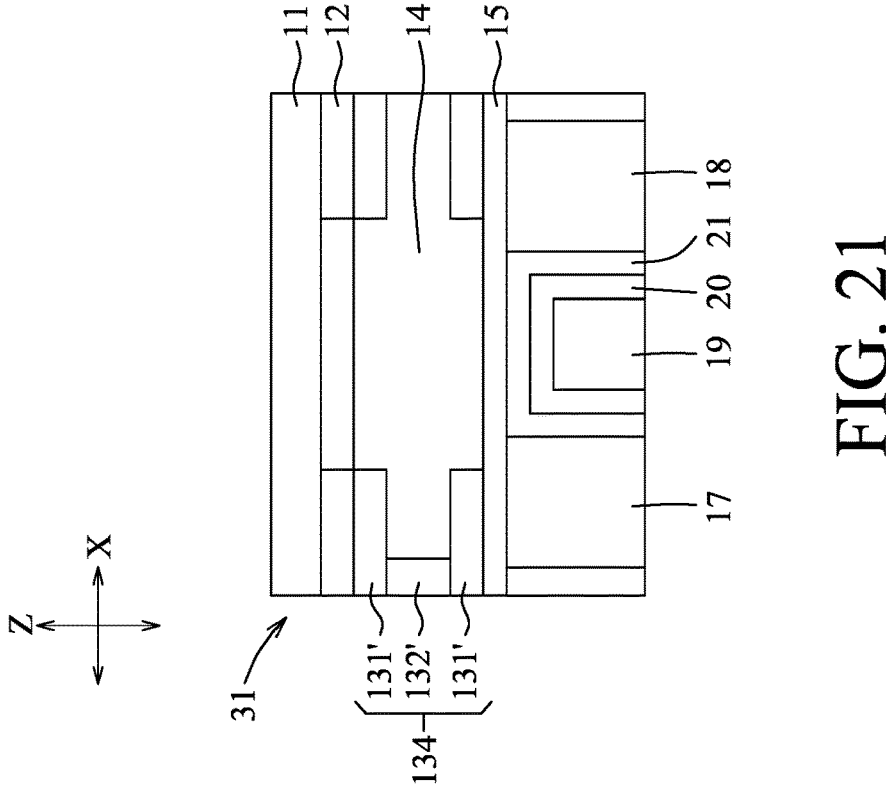
Figure 20:
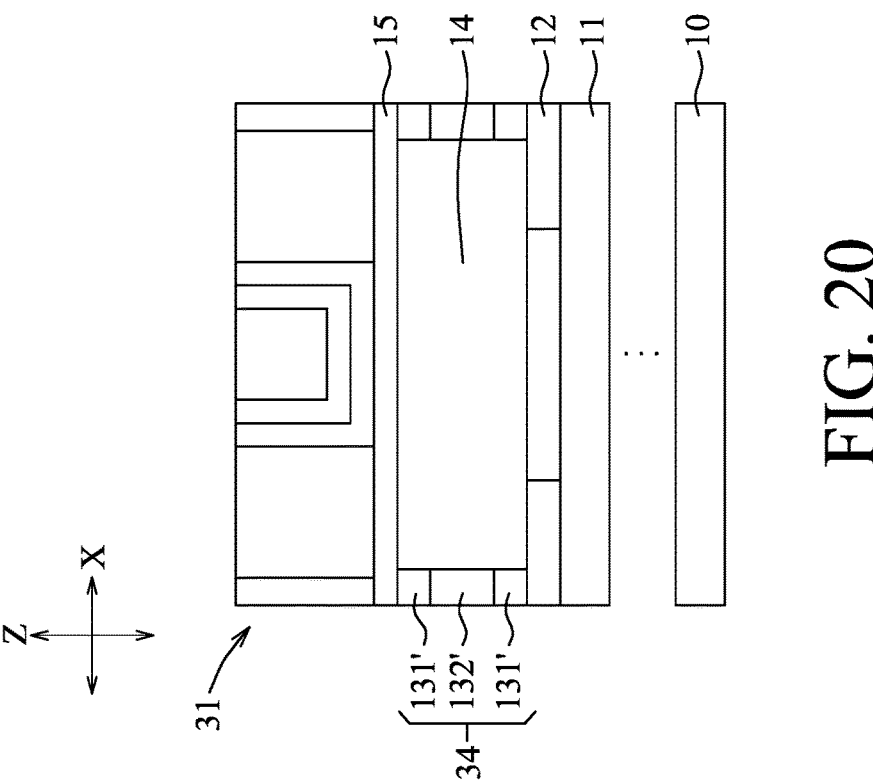

FIGS. 13 to 20 are schematic views illustrating various configurations of the dielectric stack region 134 of each of the memory cells 31 in accordance with some embodiments. In some embodiments, as illustrated in FIG. 13, the second dielectric portion 132' of the dielectric stack region 134 includes a lower surface and a lateral surface which is inclined relative to the lower surface, such that an angle between the lower surface and the lateral surface of the second dielectric portion 132' is an acute angle. In some embodiments, as illustrated in FIG. 14, the angle between the lower surface and the lateral surface of the second dielectric portion 132' is an obtuse angle. In some embodiments, as illustrated in FIG. 15, the lateral surface of the second dielectric portion 132' of the dielectric stack region 134 is configured in a concave shape. In some embodiments, as illustrated in FIG. 16, the lateral surface of the second dielectric portion 132' of the dielectric stack region 134 is configured in a convex shape. In some embodiments, as illustrated in FIG. 17, the dielectric stack region 134 may include a plurality of the first dielectric portions 131' and a plurality of the second dielectric portions 132', which are alternately stacked on the dielectric layer 12. The lowermost portion of the dielectric stack region 134 is the first dielectric portion 131', which is disposed to be in contact with the dielectric layer 12. In some embodiments, as illustrated in FIG. 18, the dielectric stack region 134 may include the second dielectric portion 132' disposed on the dielectric layer 12 and the first dielectric portion 131' that is disposed on the second dielectric portion 132' and that is separated from the dielectric layer 12 by the second dielectric portion 132'. In some embodiments, as illustrated in FIG. 19, the dielectric stack region 134 may include a plurality of the first dielectric portions 131' and a plurality of the second dielectric portions 132', which are alternately stacked on the dielectric layer 12. The lowermost portion of the dielectric stack region 134 is the second dielectric portion 132', which is disposed to be in contact with the dielectric layer 12. In some embodiments, as illustrated in FIG. 20, a lateral surface of the second dielectric portion 132' is aligned with that of the first dielectric portion 131'. In some embodiments, as illustrated in FIG. 21, the memory cell 31 may have a configuration which is reverse to that of the memory cell 31 illustrated in FIG. 10B. In the configuration of the memory cell 31 illustrated in FIG. 21, the first source/drain electrode (i.e., the first conductive block 17), the second source/drain electrode (i.e., the second conductive block 18), the assistant gate electrode (i.e., the third conductive block 19), the dielectric spacer 20, and the channel feature 21 are disposed between the gate electrode (i.e., a portion of the conductive region 14) and a substrate (not shown). The memory cell 31 having the configuration shown in FIG. 21 may be formed by bonding an upper surface of the semiconductor memory structure 30 shown in FIG. 10A to a carrier substrate, flipping over the semiconductor memory structure 30, and removing the substrate 10 shown in FIG. 2A by a planarization process, e.g., a CMP process. Similarly, in some embodiments, the memory cell 31 may have a configuration which is reverse to that of the memory cell 31 illustrated in each of FIGS. 13 to 20.

In a semiconductor device of the present disclosure, a semiconductor memory structure of the semiconductor device includes a plurality of memory cells arranged in an array. Each of the memory cells includes a word line portion serving as a gate electrode, a first conductive block serving as a first source/drain electrode, a second conductive block serving as a second source/drain electrode, a third conductive block which is disposed between and separated from the first conductive block and the second conductive block and which serves as an assistant gate electrode, a channel feature serving as a channel, and a memory region serving as a gate dielectric. The memory region is disposed such that the word line portion is located on a first surface of the memory region and such that the first conductive block, the second conductive block, the third conductive block, and the channel feature are located on a second surface of the memory region opposite to the first surface. A memory window of each of the memory cells can be enhanced by introducing the third conductive block (i.e., the assistant gate electrode) between the first conductive block (i.e., the first source/drain electrode) and the second conductive block (i.e., the second source/drain electrode).

In accordance with some embodiments of the present disclosure, a memory structure includes a memory cell. The memory cell includes a memory region having a first surface and a second surface opposite to each other, a word line portion disposed on the first surface of the memory region, a first conductive block disposed on the second surface of the memory region, a second conductive block disposed on the second surface of the memory region, and a third conductive block disposed on the second surface of the memory region such that the third conductive block is disposed between and separated from the first conductive block and the second conductive block.

In accordance with some embodiments of the present disclosure, the memory cell further includes a channel feature disposed to be in contact with the first conductive block and the second conductive block and to separate the first conductive block and the second conductive block from the third conductive block.

In accordance with some embodiments of the present disclosure, the memory cell further includes a dielectric spacer disposed to surround and laterally cover the third conductive block and to separate the third conductive block from the channel feature.

In accordance with some embodiments of the present disclosure, the memory structure further includes a dielectric stack region which laterally cover the word line portion and which includes at least one first dielectric portion and at least one second dielectric portion. The first dielectric portion includes a first dielectric material. The second dielectric portion includes a second dielectric material different from the first dielectric material.

In accordance with some embodiments of the present disclosure, the word line portion serves as a gate electrode of the memory cell, the first conductive block serves as a first source/drain electrode of the memory cell, the second conductive block serves as a second source/drain electrode of the memory cell, the third conductive block serves as an assistant gate electrode of the memory cell, and the memory region serves as a gate dielectric of the memory cell.

In accordance with some embodiments of the present disclosure, the channel feature serves as a channel of the memory cell.

In accordance with some embodiments of the present disclosure, the second dielectric portion has a width less than that of the first dielectric portion.

In accordance with some embodiments of the present disclosure, the first dielectric portion has a lateral surface aligned with a lateral surface of the second dielectric portion.

In accordance with some embodiments of the present disclosure, the second dielectric portion includes a lower surface and a lateral surface which is inclined relative to the lower surface, such that an angle between the lower surface and the lateral surface is an acute angle.

In accordance with some embodiments of the present disclosure, the second dielectric portion includes a lower surface and a lateral surface which is inclined relative to the lower surface, such that an angle between the lower surface and the lateral surface is an obtuse angle.

In accordance with some embodiments of the present disclosure, the second dielectric portion includes a lateral surface configured in a concave shape.

In accordance with some embodiments of the present disclosure, the second dielectric portion (132') includes a lateral surface configured in a convex shape.

In accordance with some embodiments of the present disclosure, the dielectric stack region includes a plurality of the first dielectric portions and a plurality of the second dielectric portions disposed to alternate with the first dielectric portions. A lowermost portion of the dielectric stack region is the first dielectric portion.

In accordance with some embodiments of the present disclosure, the dielectric stack region includes a plurality of the first dielectric portions and a plurality of the second dielectric portions disposed to alternate with the first dielectric portions. A lowermost portion of the dielectric stack region is the second dielectric portion.

In accordance with some embodiments of the present disclosure, a semiconductor device includes a substrate and a memory structure disposed over the substrate. The memory structure includes a memory film, a plurality of conductive regions, a plurality of first conductive blocks, a plurality of second conductive blocks, and a plurality of third conductive blocks. The memory film has a first surface and a second surface opposite to the first surface. The conductive regions are disposed on the first surface of the memory film. The conductive regions are spaced apart from each other in a first direction and extend in a second direction transverse to the first direction. The first conductive blocks are disposed on the second surface of the memory film. The first conductive blocks are arranged in an array, which include a plurality of columns of the first conductive blocks spaced apart from each other in the first direction. The first conductive blocks in each column are spaced apart from each other in the second direction. The second conductive blocks are disposed on the second surface of the memory film. The second conductive blocks are arranged in an array, which include a plurality of columns of the second conductive blocks spaced apart from each other in the first direction. The second conductive blocks in each column are spaced apart from each other in the second direction. The plurality of columns of the second conductive blocks are disposed to alternate with and separate from the plurality of columns of the first conductive blocks. The third conductive blocks are disposed on the second surface of the memory film. The third conductive blocks are arranged in an array, which includes a plurality of columns of the third conductive blocks spaced apart from each other in the first direction. The third conductive blocks in each column are spaced apart from each other in the second direction. Each column of the third conductive blocks is disposed between and spaced apart from a corresponding column of the first conductive blocks and a corresponding column of the second conductive blocks in the first direction. Each of the third conductive blocks is disposed between and spaced apart from a corresponding one of the first conductive blocks and a corresponding one of the second conductive blocks in the first direction.

In accordance with some embodiments of the present disclosure, the semiconductor device further includes a plurality of dielectric spacers disposed on the second surface of the memory film. The dielectric spacers are arranged in an array, which include a plurality of columns of the dielectric spacers spaced apart from each other in the first direction. The dielectric spacers in each column are spaced apart from each other in the second direction. Each of the dielectric spacers is disposed to cover a bottom surface and a lateral surface of a corresponding one of the third conductive blocks and to separate the corresponding one of the third conductive blocks from a corresponding one of the first conductive blocks and a corresponding one of the second conductive blocks.

In accordance with some embodiments of the present disclosure, the semiconductor device further includes a plurality of chancel features disposed on the second surface of the memory film. The channel features are arranged in an array, which include a plurality of columns of the channel features spaced apart from each other in the first direction. The channel features in each column are spaced apart from each other in the second direction. Each of the channel features is disposed to cover a bottom surface and a lateral surface of a corresponding one of the dielectric spacers and to separate the corresponding one of the dielectric spacers from a corresponding one of the first conductive blocks and a corresponding one of the second conductive blocks.

In accordance with some embodiments of the present disclosure, a method for manufacturing a semiconductor device includes: forming a memory film over a substrate; forming a plurality of conductive regions on a first surface of the memory film, such that the conductive regions is spaced apart from each other in a first direction and extend in a second direction transverse to the first direction; forming a plurality of first conductive blocks on a second surface of the memory film, such that the first conductive blocks are arranged in an array, which include a plurality of columns of the first conductive blocks spaced apart from each other in the first direction, the first conductive blocks in each column being spaced apart from each other in the second direction; forming a plurality of second conductive blocks on the second surface of the memory film, such that the second conductive blocks are arranged in an array, which include a plurality of columns of the second conductive blocks spaced apart from each other in the first direction, the second conductive blocks in each column being spaced apart from each other in the second direction, the plurality of columns of the second conductive blocks being disposed to alternate with and separate from the plurality of columns of the first conductive blocks; and forming a plurality of third conductive blocks on the second surface of the memory film, such that the third conductive blocks are arranged in an array, which includes a plurality of columns of the third conductive blocks spaced apart from each other in the first direction, the third conductive blocks in each column being spaced apart from each other in the second direction, each column of the third conductive blocks being disposed between and spaced apart from a corresponding column of the first conductive blocks and a corresponding column of the second conductive blocks in the first direction, each of the third conductive blocks being disposed between and spaced apart from a corresponding one of the first conductive blocks and a corresponding one of the second conductive blocks in the first direction.

In accordance with some embodiments of the present disclosure, the method for manufacturing a semiconductor device further includes forming a plurality of dielectric spacers on the second surface of the memory film, such that the dielectric spacers are arranged in an array, which include a plurality of columns of the dielectric spacers spaced apart from each other in the first direction, the dielectric spacers in each column being spaced apart from each other in the second direction, each of the dielectric spacers being disposed to cover a bottom surface and a lateral surface of a corresponding one of the third conductive blocks and to separate the corresponding one of the third conductive blocks from a corresponding one of the first conductive blocks and a corresponding one of the second conductive blocks.

In accordance with some embodiments of the present disclosure, the method for manufacturing a semiconductor device further includes forming a plurality of channel features on the second surface of the memory film, such that the channel features are arranged in an array, which include a plurality of columns of the channel features spaced part from each other in the first direction, the chancel features in each column being spaced apart from each other in the second direction, each of the channel features being disposed to cover a bottom surface and a lateral surface of a corresponding one of the dielectric spacers and to separate the corresponding one of the dielectric spacers from a corresponding one of the first conductive blocks and a corresponding one of the second conductive blocks.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:
   a memory cell including:
      a memory region having a first surface and a second surface opposite to each other;
      a word line portion disposed on the first surface of the memory region;
      a first conductive block disposed on the second surface of the memory region;
      a second conductive block disposed on the second surface of the memory region;
      a third conductive block disposed on the second surface of the memory region such that the third conductive block is disposed between and separated from the first conductive block and the second conductive block; and
      a channel feature disposed to be in contact with the first conductive block and the second conductive block and to separate the first conductive block and the second conductive block from the third conductive block.

2. The memory structure according to claim 1, wherein the memory cell further includes a dielectric spacer disposed to surround and laterally cover the third conductive block and to separate the third conductive block from the channel feature.

3. The memory structure according to claim 1, further comprising a dielectric stack region which laterally cover the word line portion and which includes at least one first dielectric portion and at least one second dielectric portion, the first dielectric portion including a first dielectric material, the second dielectric portion including a second dielectric material different from the first dielectric material.

4. The memory structure according to claim 3, wherein the second dielectric portion has a width less than that of the first dielectric portion.

5. The memory structure according to claim 3, wherein the first dielectric portion has a lateral surface aligned with a lateral surface of the second dielectric portion.

6. The memory structure according to claim 3, wherein the second dielectric portion includes a lower surface and a lateral surface which is inclined relative to the lower surface, such that an angle between the lower surface and the lateral surface is an acute angle.

7. The memory structure according to claim 3, wherein the second dielectric portion includes a lower surface and a lateral surface which is inclined relative to the lower surface, such that an angle between the lower surface and the lateral surface is an obtuse angle.

8. The memory structure according to claim 3, wherein the second dielectric portion includes a lateral surface configured in a concave shape.

9. The memory structure according to claim 3, wherein the second dielectric portion includes a lateral surface configured in a convex shape.

10. The memory structure according to claim 3, wherein the dielectric stack region includes a plurality of the first dielectric portions and a plurality of the second dielectric portions disposed to alternate with the first dielectric portions, a lowermost portion of the dielectric stack region being the first dielectric portion.

11. The memory structure according to claim 3, wherein the dielectric stack region includes a plurality of the first dielectric portions and a plurality of the second dielectric portions disposed to alternate with the first dielectric portions, a lowermost portion of the dielectric stack region being the second dielectric portion.

12. The memory structure according to claim 1, wherein the word line portion serves as a gate electrode of the memory cell, the first conductive block serves as a first source/drain electrode of the memory cell, the second conductive block serves as a second source/drain electrode of the memory cell, the third conductive block serves as an assistant gate electrode of the memory cell, and the memory region serves as a gate dielectric of the memory cell.

13. The memory structure according to claim 2, further comprising a substrate disposed in a manner in which the first conductive block, the second conductive block, the third conductive block, and the channel feature are disposed between the gate electrode and the substrate.

14. The memory structure according to claim 1, wherein the channel feature serves as a channel of the memory cell.

15. A semiconductor device comprising:
   a substrate; and a memory structure disposed over the substrate and including:

a memory film having a first surface and a second surface opposite to the first surface, a plurality of conductive regions disposed on the first surface of the memory film, the conductive regions being spaced apart from each other in a first direction and extending in a second direction transverse to the first direction, a plurality of first conductive blocks disposed on the second surface of the memory film, the first conductive blocks being arranged in an array, which include a plurality of columns of the first conductive blocks spaced apart from each other in the first direction, the first conductive blocks in each column being spaced apart from each other in the second direction, a plurality of second conductive blocks disposed on the second surface of the memory film, the second conductive blocks being arranged in an array, which include a plurality of columns of the second conductive blocks spaced apart from each other in the first direction, the second conductive blocks in each column being spaced apart from each other in the second direction, the plurality of columns of the second conductive blocks being disposed to alternate with and separate from the plurality of columns of the first conductive blocks, and a plurality of third conductive blocks disposed on the second surface of the memory film, the third conductive blocks being arranged in an array, which includes a plurality of columns of the third conductive blocks spaced apart from each other in the first direction, the third conductive blocks in each column being spaced apart from each other in the second direction, each column of the third conductive blocks being disposed between and spaced apart from a corresponding column of the first conductive blocks and a corresponding column of the second conductive blocks in the first direction, each of the third conductive blocks being disposed between and spaced apart from a corresponding one of the first conductive blocks and a corresponding one of the second conductive blocks in the first direction.

16. The semiconductor device according to claim 15, further comprising:

a plurality of dielectric spacers disposed on the second surface of the memory film, the dielectric spacers being arranged in an array, which include a plurality of columns of the dielectric spacers spaced apart from each other in the first direction, the dielectric spacers in each column being spaced apart from each other in the second direction, each of the dielectric spacers being disposed to cover a bottom surface and a lateral surface of a corresponding one of the third conductive blocks and to separate the corresponding one of the third conductive blocks from a corresponding one of the first conductive blocks and a corresponding one of the second conductive blocks.

17. The semiconductor device according to claim 16, further comprising:

a plurality of chancel features disposed on the second surface of the memory film, the channel features being arranged in an array, which include a plurality of columns of the channel features spaced apart from each other in the first direction, the channel features in each column being are spaced apart from each other in the second direction, each of the channel features being disposed to cover a bottom surface and a lateral surface of a corresponding one of the dielectric spacers and to separate the corresponding one of the dielectric spacers from a corresponding one of the first conductive blocks and a corresponding one of the second conductive blocks.

18. A method for manufacturing a semiconductor device, comprising:

forming a memory film over a substrate;

forming a plurality of conductive regions on a first surface of the memory film, such that the conductive regions is spaced apart from each other in a first direction and extend in a second direction transverse to the first direction;

forming a plurality of first conductive blocks on a second surface of the memory film, such that the first conductive blocks are arranged in an array, which include a plurality of columns of the first conductive blocks spaced apart from each other in the first direction, the first conductive blocks in each column being spaced apart from each other in the second direction;

forming a plurality of second conductive blocks on the second surface of the memory film, such that the second conductive blocks are arranged in an array, which include a plurality of columns of the second conductive blocks spaced apart from each other in the first direction, the second conductive blocks in each column being spaced apart from each other in the second direction, the plurality of columns of the second conductive blocks being disposed to alternate with and separate from the plurality of columns of the first conductive blocks; and forming a plurality of third conductive blocks on the second surface of the memory film, such that the third conductive blocks are arranged in an array, which includes a plurality of columns of the third conductive blocks spaced apart from each other in the first direction, the third conductive blocks in each column being spaced apart from each other in the second direction, each column of the third conductive blocks being disposed between and spaced apart from a corresponding column of the first conductive blocks and a corresponding column of the second conductive blocks in the first direction, each of the third conductive blocks being disposed between and spaced apart from a corresponding one of the first conductive blocks and a corresponding one of the second conductive blocks in the first direction.

19. The method according to claim 18, further comprising forming a plurality of dielectric spacers on the second surface of the memory film, such that the dielectric spacers are arranged in an array, which include a plurality of columns of the dielectric spacers spaced apart from each other in the first direction, the dielectric spacers in each column being spaced apart from each other in the second direction, each of the dielectric spacers being disposed to cover a bottom surface and a lateral surface of a corresponding one of the third conductive blocks and to separate the corresponding one of the third conductive blocks from a corresponding one of the first conductive blocks and a corresponding one of the second conductive blocks.

20. The method according to claim 19, further comprising forming a plurality of channel features on the second surface of the memory film, such that the channel features are arranged in an array, which include a plurality of columns of the channel features spaced part from each other in the first direction, the chancel features in each column being spaced apart from each other in the second direction, each of the channel features being disposed to cover a bottom surface and a lateral surface of a corresponding one of the dielectric spacers and to separate the corresponding one of the dielectric spacers from a corresponding one of the first conductive blocks and a corresponding one of the second conductive blocks.

\* \* \* \* \*